United States Patent [19]
Sugiyama

[11] Patent Number: 6,009,015
[45] Date of Patent: Dec. 28, 1999

[54] PROGRAM-VERIFY CIRCUIT AND PROGRAM-VERIFY METHOD

[75] Inventor: Toshinobu Sugiyama, Kanagawa, Japan

[73] Assignee: Sony Corporation, Japan

[21] Appl. No.: 09/305,112

[22] Filed: May 4, 1999

[30] Foreign Application Priority Data

May 8, 1998 [JP] Japan ................................ P10-125820

[51] Int. Cl.$^6$ .................................................. G11C 11/40
[52] U.S. Cl. ............................ 365/185.22; 365/185.01; 365/185.24; 365/230.08
[58] Field of Search .................. 365/230.01, 230.08, 365/185.01, 185.22, 185.24

[56] References Cited

U.S. PATENT DOCUMENTS 4,612,630  9/1986  Rosier .................................... 365/201
5,822,248 10/1998 Satori et al. ...................... 365/185.21

*Primary Examiner*—Viet Q. Nguyen
*Attorney, Agent, or Firm*—Rader, Fishman & Grauer; Ronald P. Kananen

[57] ABSTRACT

A program-verify circuit for an electrically re-writable memory cell which has a floating gate and a control gate and permits storage of a ternary or higher multi-valued data, the program-verify circuit comprising (1) a variable threshold voltage field-effect transistor having a plurality of input gate electrodes, and (2) a latch circuit, wherein the latch circuit is connected to one source/drain region of the variable threshold voltage field-effect transistor and is to be connected to the memory cell through a bit line, one of the input gate electrodes of the variable threshold voltage field-effect transistor is to be connected to the memory cell through the bit line, and a potential for controlling the conduction/non-conduction state of the variable threshold voltage field-effect transistor is to be applied to the rest of the input gate electrodes.

10 Claims, 15 Drawing Sheets

PROGRAM-VERIFY CIRCUIT AND PROGRAM-VERIFY METHOD

BACKGROUND OF THE INVENTION AND RELATED ART STATEMENT

The present invention relates to a program-verify circuit for an electrically re-writable memory cell which has a floating gate and a control gate and permits storage of a multi-valued (multi-bit or multilevel) data such as ternary or higher data, and a program-verify method using the above program-verify circuit.

In recent years, developments have been aggressively made on a memory cell having a floating gate and a control gate and being electrically re-writable. The above memory cell will be simply abbreviated as "memory cell" hereinafter. The memory cell is constituted of one memory element or composed of a plurality of memory elements depending upon types. As a technique for materializing a large capacity and a low cost of a memory cell, the technique of multi-bit (multilevel) storage for storing data of 2 bits or more, i.e., a ternary or multi-valued data in one memory element is attracting attention. In specific methods of multi-bit storage, which methods are applied to a memory element, various methods are proposed concerning data readout methods, program-verify methods (data writing methods), and so forth, depending upon differences in types such as a NOR type nonvolatile semiconductor memory cell (to be referred to as "NOR type memory cell" hereinafter), a NAND type nonvolatile semiconductor memory cell (to be referred to as "NAND type memory cell" hereinafter) and the like.

The performance method of a NOR type memory cell proposed by Intel Corp. will be outlined below. For details, see "NIKKEI MICRODEVICE", November issue of 1997, pages 126 to 130 (to be referred to as "Literature" hereinafter).

FIG. 4A shows the cell-array structure of the above NOR type memory cell. FIG. 4B shows a schematic partial cross-sectional view of a memory element constituting the NOR type memory cell. The structures of the cell-array and the memory element are the same as those of a conventional NOR type memory cell. In writing of data into the memory cell, when a positive high voltage is applied to a word line and a positive high voltage is applied to a bit line, hot electrons generated in a drain region of the memory element are injected into a floating gate (also called a floating electrode or a charge storage electrode) to set a threshold voltage $V_{th}$ of the memory element at a desired value. The value of the threshold voltage $V_{th}$ of the memory element, i.e., the injection amount of electrons into the floating gate is controlled by accurately controlling the voltage to be applied to a control gate (also called a control electrode) and the drain region. When data is erased, electrons are extracted from the floating gate to a source region by applying a high voltage to the source region, to set the threshold voltage $V_{th}$ of the memory element at a lowest voltage.

FIG. 5 schematically shows a distribution of the memory elements with regard to reference points ($P_0$, $P_2$, $P_3$) and reference voltages ($R_1$, $R_2$, $R_3$) when 2 bits are stored in one memory element. The threshold voltages $V_{th}$ of the memory elements storing data (1,1), (1,0), (0,1) and (0,0) and the reference voltages $V_{R1}$, $V_{R2}$ and $V_{R3}$ have relationships as shown in the following Table 1.

TABLE 1

| Data (1,1) | $V_{th} < V_{R1}$ |
| Data (1,0) | $V_{R1} < V_{th} < V_{R3}$ |
| Data (0,1) | $V_{R2} < V_{th} < V_{R3}$ |
| Data (0,0) | $V_{R3} / V_{th}$ |

In data readout performance, as schematically shown in FIG. 15, a current is flowed in a selected bit line, and the current flowing in the bit line is compared through three sensing amplifiers. A bias condition to the memory element is determined such that the current $I_{cell}$ flowing in the bit line is in proportion to the threshold voltage $V_{th}$. Outputs from the three sensing amplifiers are inputted to a logic circuit, which converts the above outputs to two parallel outputs $D_0$ and $D_1$. When data stored in the memory element is (1,1), $I_{R1ref} < I_{cell}$, and all the sensing amplifiers output "1", the logic circuit outputs "11". When data stored in the memory element is (1,0), $I_{R2ref} < I_{cell} < I_{R1ref}$, and the sensing amplifier 1 outputs "0" and the sensing amplifiers 2 and 3 output "1", so that the logic circuit outputs "10". When data stored in the memory element is (0,1), $I_{R3ref} < I_{cell} < I_{R2ref}$, the sensing amplifiers 1 and 2 output "0" and the sensing amplifier 3 outputs "1", so that the logic circuit outputs "01". When data stored in the memory element is (0,0), $I_{cell} < I_{R3ref}$, all the sensing amplifiers output "0", so that the logic circuit outputs "00".

The program-verify is performed on a similar mechanism.

Several configuration examples of a multi-bit NAND type memory cell have been also reported. For example, as a method of reading multi-valued data, one example is a method in which a word line potential is changed to compare an output potential of a bit line with a reference potential, and another example is a method in which a potential level which appears in a bit line is directly read out when a predetermined potential is applied to a common source line while a word line potential is fixed. The latter method is disclosed, e.g., in JP-A-7-307091.

In the NOR type memory cell shown in the above Literature, multi-valued data can be converted to binary data at once, and there is an advantage that there is almost no difference in the readout rate in a multi-valued method and that in a binary method. However, as shown in FIG. 15, three sensing amplifiers are required per bit line, and further, a reference cell-array is also required, so that there are problems that a circuit configuration is complicated and that a layout area is increased. The nonvolatile semiconductor storage device disclosed in JP-A-7-307094 has similar problems that its circuit configuration is complicated and a layout area is increased.

OBJECT AND SUGARY OF THE INVENTION

It is therefore an object of the present invention to provide a program-verify circuit which has a simple circuit configuration and requires no increase in a layout area, incorporated in an electrically re-writable memory cell having a floating gate and a control gate and permitting storage of a multi-valued data such as ternary or higher data, and a program-verify method using the above program-verify circuit.

The program-verify circuit of the present invention for achieving the above object is a program-verify circuit for an electrically re-writable memory cell which has a floating gate and a control gate and permits storage of a ternary or higher multi-valued (multi-bit or multilevel) data, the program-verify circuit comprising;

(1) a variable threshold voltage field-effect transistor having a plurality of input gate electrodes, and (2) a latch circuit, wherein the latch circuit is connected to one source/drain region of the variable threshold voltage field-effect transistor and is to be connected to the memory cell through a bit line, one of the input gate electrodes of the variable threshold voltage field-effect transistor is to be connected to the memory cell through the bit line, and a potential for controlling a conduction/non-conduction state of the variable threshold voltage field-effect transistor is to be applied to the rest of the input gate electrodes.

The program-verify method of the present invention for achieving the above object is a program-verify method used in an electrically re-writable memory cell which has a floating gate and a control gate and permits storage of a ternary or higher multi-valued (multi-bit or multilevel) data, the method using a program-verify circuit comprising;
(1) a variable threshold voltage field-effect transistor having a plurality of input gate electrodes, and
(2) a latch circuit, wherein the latch circuit is connected to one source/drain region of the variable threshold voltage field-effect transistor and is connected to the memory cell through a bit line, one of the input gate electrodes of the variable threshold voltage field-effect transistor is connected to the memory cell through the bit line, and a potential for controlling a conduction/non-conduction state of the variable threshold voltage field-effect transistor is applied to the rest of the input gate electrodes such that when a bit line output potential reaches a predetermined potential, the variable threshold voltage field-effect transistor is controlled to be brought from a non-conduction state into a conduction state, the program-verify method comprising a program-cycle and a verify-cycle, wherein, in the program-cycle, when data is to be written in the memory cell, a potential based on initial data latched in the latch circuit is outputted to the bit line, and in the verify-cycle, when the bit line output potential has not reached the predetermined potential, the program-cycle is re-performed, and when the bit line output potential has reached the predetermined potential, the variable threshold voltage field-effect transistor is brought from the non-conduction state into the conduction state to invert the initial data latched in the latch circuit, whereby further writing of data into the memory cell is inhibited.

In the program-verify circuit or the program-verify method of the present invention, "controlling the conduction/non-conduction state of the variable threshold voltage field-effect transistor" means that the variable threshold voltage field-effect transistor is brought from the non-conduction state into the conduction state when the bit line output potential to be inputted to one of the input gate electrodes reaches a certain potential (to be referred to as "$P_B$" for convenience), by applying a certain potential (to be referred to as "$P_A$" for convenience) to the rest of the input gate electrodes, and that the variable threshold voltage field-effect transistor is brought from the non-conduction state into the conduction state by applying a potential different from the potential $P_A$ to the rest of the input gate electrodes even if the bit line output potential to be inputted to one of the input gate electrodes is different from the potential $P_B$. That is, it means that the apparent threshold voltage of the variable threshold voltage field-effect transistor is changed by applying various values of the potential to the rest of the input gate electrodes.

In view of simplification of circuit configuration, the variable threshold voltage field-effect transistor in the program-verify circuit of the present invention preferably comprises (A) source/drain regions, (B) a channel forming region between the source/drain regions, (C) one floating electrode formed on a first insulating film formed on the channel forming region and (D) a plurality of input gate electrodes formed on a second insulating film formed on the floating electrode.

The program-verify circuit of the present invention preferably has a configuration in which a digital/analog converter is further provided and the digital/analog converter is to output a potential for controlling the conduction/non-conduction state of the above variable threshold voltage field-effect transistor constituting the program-verify circuit. In view of simplification of the circuit configuration, preferably, the digital/analog converter is a variable threshold voltage field-effect transistor which comprises (a) source/drain regions, (b) a channel forming region between the source/drain regions, (c) one floating electrode formed on a first insulating film formed on the channel forming region and (d) a plurality of input gate electrodes which are formed on a second insulating film formed on the floating electrode and into which signals corresponding to multi-valued data to be stored are inputted, and a potential for controlling the conduction/non-conduction state of the above variable threshold voltage field-effect transistor constituting the program-verify circuit is outputted from one of the source/drain regions of the variable threshold voltage field-effect transistor constituting the digital/analog converter.

The program-verify circuit of the present invention may have a configuration in which a read circuit constituted of an analog/digital converter and the above digital/analog converter which comprises the variable threshold voltage field-effect transistor is further provided, an input portion of the analog/digital converter is connected to the bit line, output portions of the analog/digital converter are connected to the input gate electrodes of the variable threshold voltage field-effect transistor constituting the digital/analog converter, and one of the source/drain regions of the variable threshold voltage field-effect transistor constituting the digital/analog converter is also connected to the input portion of the analog/digital converter. In this case, there may be employed a configuration in which the variable threshold voltage field-effect transistor constituting the digital/analog converter has two input gate electrodes, the analog/digital converter comprises a variable threshold voltage inverter having two input portions and one output portion, and first, second and third inverters which are CMOS inverters, one of the input portions of the variable threshold voltage inverter and an input portion of the first inverter are connected to the bit line, an output portion of the first inverter is connected to the other of the input portions of the variable threshold voltage inverter and to an input portion of the third inverter, the output portion of the variable threshold voltage inverter is connected to an input portion of the second inverter, and output portions of the second and third inverters are respectively connected to the two input gate electrodes of the digital/analog converter. Preferably, the variable threshold voltage inverter comprises a neuron CMOS transistor which is a combination of a p-channel type MOS transistor and an n-channel type MOS transistor. The neuron CMOS transistor will be described later.

In the program-verify circuit of the present invention, preferably, the variable threshold voltage field-effect transistor is controlled such that it is brought from a non-conduction state into a conduction state when the bit line output potential reaches a predetermined potential.

The memory cell can be formed as a NOR type nonvolatile semiconductor memory cell or a NAND type nonvolatile semiconductor memory cell.

In the present invention, part of the program-verify circuit is constituted of the variable threshold voltage field-effect transistor, so that the circuit configuration of the program-verify circuit can be simplified as compared with any prior art circuit configuration.

BRIEF DESCRIPTION OF THE DRAWINGS

The present invention will be explained in detail with reference to drawings hereinafter.

DESCRIPTION OF THE PREFERRED EMBODIMENTS

Example 1

Figure 4A:
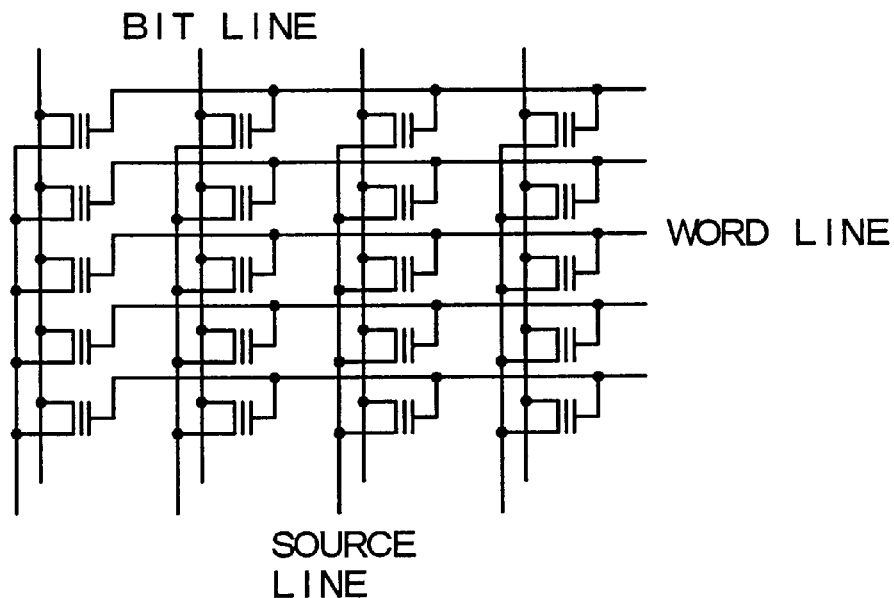
FIG. 4A shows a cell-array structure of a NOR type memory cell.
Figure 4B:
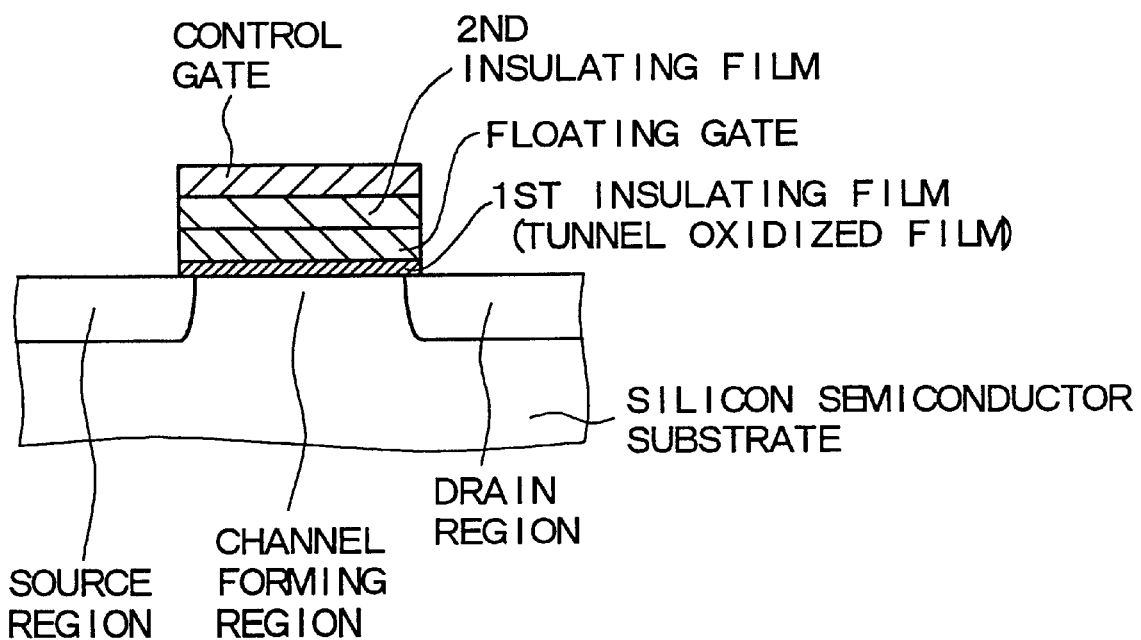
FIG. 4B is a schematic partial cross-sectional view of a memory element constituting the NOR type memory cell.
Figure 5:
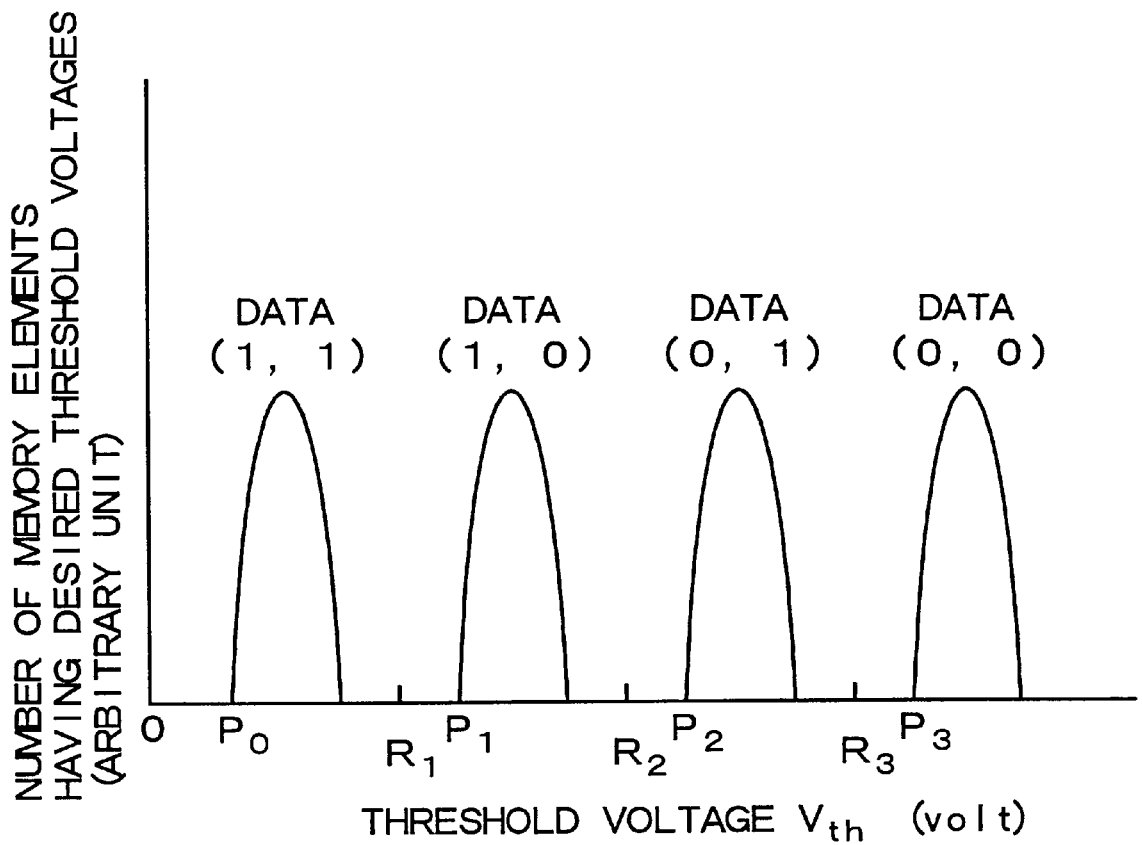
FIG. 5 schematically shows a distribution of memory elements with regard to reference points ($P_0$, $P_1$, $P_2$, $P_3$) and reference voltages ($R_1$, $R_2$, $R_3$) when 2 bits are stored in one memory element.

Example 1 is concerned with an example in which the program-verify circuit of the present invention is applied to a NOR type memory cell which has a floating gate and a control gate, stores ternary or higher data (quaternary data in Example 1) and permits electrical re-writing. The cell-array structure of the NOR type memory cell and the schematic partial cross-sectional view of the memory element constituting the NOR type memory cell are as shown in FIGS. 4A and 4B. Data to be stored in the memory element are expressed as (1,1), (1,0), (0,1) and (0,0). Threshold voltages (positive voltages) when 2 bits are stored in one memory element, i.e., threshold voltages of the memory element when data stored in the memory element are (1,1), (1,0), (0,1) and (0,0) are described as $V_{th-11}$, $V_{th-10}$, $V_{th-01}$ and $V_{th-00}$ (provided that $V_{th-11} < V_{th-10} < V_{th-01} < V_{th-00}$). These threshold voltages $V_{th}$ have a distribution shown in FIG. 5. In this case, the lowest threshold voltage $V_{th-11}$ corresponds to a data-erased state, i.e., data (1,1).

The performance of writing of data into the memory element comprises a program-cycle and a verify-cycle. In the program-cycle, for example, 12 volts is applied to the control gate of the memory element, and for example, 10 volts is applied to the drain region from the bit line BL. By applying the voltage to the drain region in the form of pulses, hot electrons generated in the drain region of the memory element are injected into the floating gate, to increase the threshold voltage $V_{th}$ of the memory element. In the verify-cycle, it is evaluated whether or not the threshold voltage $V_{th}$ of the memory element is a predetermined value by a performance similar to the performance of readout. When the threshold voltage $V_{th}$ of the memory element has reached the predetermined value, the performance of writing is finished. When the threshold voltage $V_{th}$ of the memory element has not reached the predetermined value, the program-cycle is re-performed. The program-cycle and the verify-cycle are repeated as described above, whereby, as the number of voltage pulses applied to the drain region from the bit line BL increases, the threshold voltage $V_{th}$ of the memory element increases and finally comes to be the predetermined value.

Figure 1:
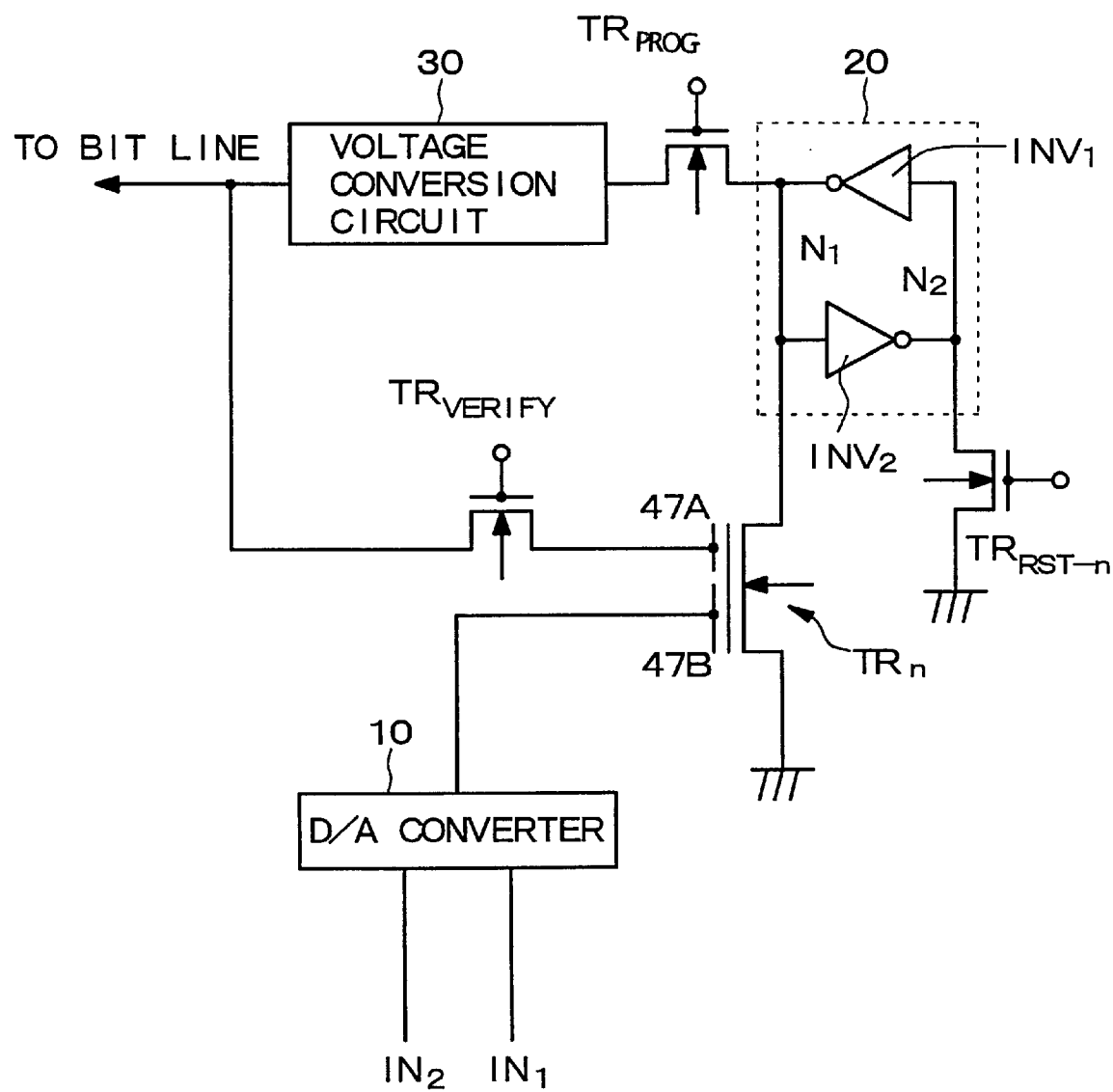
FIG. 1 is a circuit diagram of a program-verify circuit in Example 1.

FIG. 1 shows the circuit diagram of the program-verify circuit in Example 1. The program-verify circuit comprises a variable threshold voltage field-effect transistor (to be abbreviated as "variable threshold voltage transistor" hereinafter), a digital/analog converter (to be abbreviated as "D/A converter" hereinafter) 10 and a latch circuit 20. In Example 1, the variable threshold voltage transistor is a n-channel type variable threshold voltage transistor $TR_n$. Further, a voltage conversion circuit 30 is disposed between the bit line BL and the latch circuit 20. The D/A converter and the voltage conversion circuit 30 can be constituted of known circuits.

The latch circuit 20 comprises a combination of two conventional CMOS inverters $INV_1$ and $INV_2$. The variable threshold voltage transistor TR, and the voltage conversion circuit 30 are connected to the latch circuit 20 on the bit line side, and a reset transistor $T_{RST-n}$ of an n-channel type is connected to the latch circuit 20 on the side opposite to the bit line. That is, an output portion of one CMOS inverter $INV_1$ is connected to the bit line, to the variable threshold voltage transistor $TR_n$ and to an input portion of the other CMOS inverter $INV_2$. An output portion of the latter CMOS inverter $INV_2$ is connected to an input portion of the former CMOS inverter $INV_1$ and to the reset transistor $T_{RST-n}$.

Figure 2A:
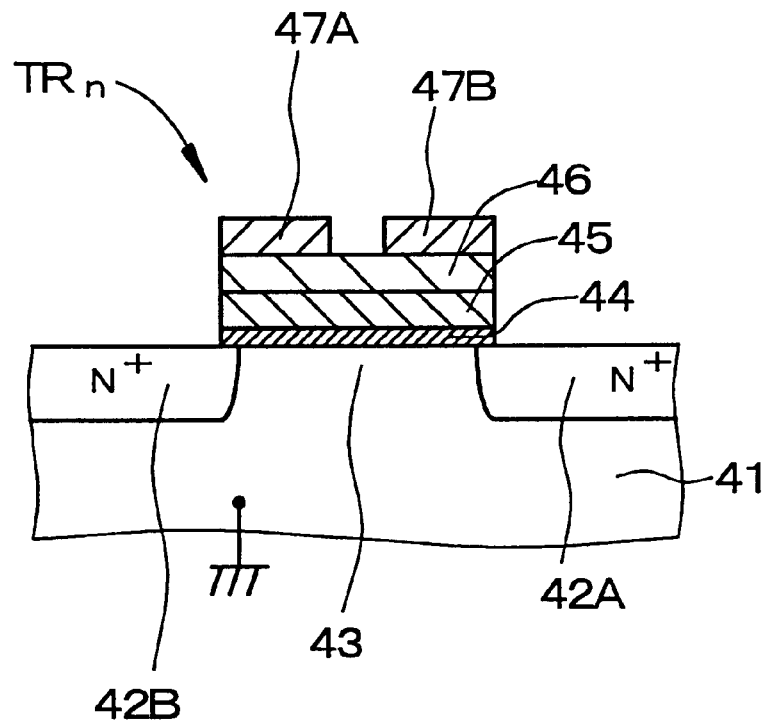
FIG. 2A is a schematic partial cross-sectional view of a variable threshold voltage field-effect transistor in Example 1.

The variable threshold voltage transistor $TR_n$ of an n-channel type is as schematically shown in FIG. 2A. For example, it comprises source/drain regions 42A and 42B (drain region 42A and source region 42B) formed in a p-type silicon semiconductor substrate 41 (or may be formed within a p-type well), a channel forming region 43 between the source/drain regions 42A and 42B, one floating electrode 45 formed on a first insulating film 44 formed on the channel forming region 43, and a plurality of input gate electrodes (two input gate electrodes in Example 1) 47A and 47B formed on a second insulating film 46 formed on the floating electrode 45. The variable threshold voltage transistor $TR_n$ having the above configuration is also called a neuron MOS transistor. For the neuron MOS transistor, see JP-A-7-200513.

Figure 2B:
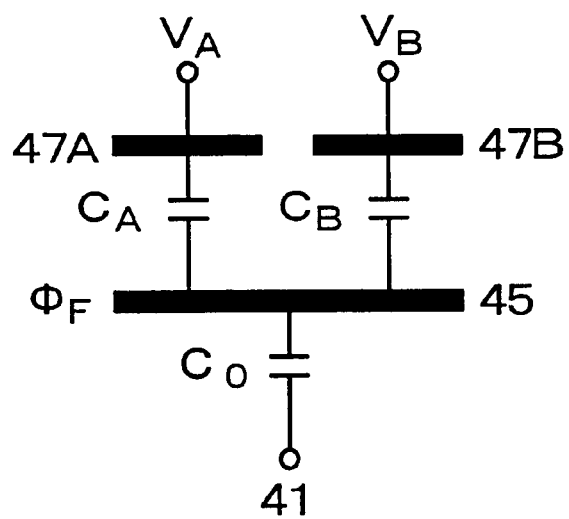
FIG. 2B is a circuit diagram equivalent thereto.

FIG. 2B shows an equivalent circuit diagram of the variable threshold voltage transistor $TR_n$. When the coupling capacity between the input gate electrode 47A and the floating electrode 45 is $C_A$ and the coupling capacity between the input gate electrode 47B and the floating electrode 45 is $C_B$, when the coupling capacity between the floating electrode 45 and the silicon semiconductor substrate 41 is $C_0$, when $C_{TOTAL}=(C_0+C_A+C_B)$, and when the potentials to be applied to the input gate electrodes 47A and 47B are $V_A$ and $V_B$, the potential $\phi_F$ of the floating electrode 45 is given by the following expression (1), provided that the silicon semiconductor substrate 41 has a potential of 0 volts.

$$\phi_F=(C_AV_A+C_BV_B)/C_{TOTAL} \quad (1)$$

The potential of the source region 42B is supposed to be 0 volt. Further, when a channel is induced in the channel forming region 43 of the n-channel type variable threshold voltage transistor $TR_n$ to bring the variable threshold voltage transistor $TR_n$ from a non-conduction state to a conduction state, the potential of the floating electrode 45 (to be referred to as "potential threshold value of variable threshold voltage transistor" hereinafter) is described as $V_{th-n}^*$. In this case, when the relationship between the potential $\phi_F$ of the floating electrode 45 and the potential threshold value $V_{th-n}$ satisfies the following expression (2), the variable threshold voltage transistor $TR_n$ is reliably conducted.

$$\phi_F > V_{th-n}^* \quad (2)$$

One input gate electrode 47A of the variable threshold voltage transistor $TR_n$ is connected to the memory cell through the bit line BL, and a potential for controlling the conduction/non-conduction state of the variable threshold voltage transistor $TR_n$ is applied to the other input gate electrode 47B. Specifically, the other input gate electrode 47B is connected to the output portion of the D/A converter 10. The latch circuit 20 is connected to the drain region 42A of the variable threshold voltage transistor $TR_n$ and is connected to the memory cell through the voltage conversion circuit 30 and the bit line BL. Moreover, signals corresponding to multi-valued data to be stored are inputted to the input portions of the D/A converter 10. That is, the two input portions of the D/A converter 10 are connected to input lines $IN_1$ and $IN_2$, and voltages corresponding to binary data of "0" data and "1" data are inputted to the two input portions of the D/A converter 10 through the input lines $IN_1$ and $IN_2$, respectively. The following Table 2 shows one example of the relationship between data to be stored in the memory cell, i.e., input data corresponding to signals to be inputted to the input portions of the D/A converter 10 and an output potential to be outputted from the output portion of the D/A converter 10. The D/A converter 10 outputs stepwise multi-valued potential. That is, the potential for controlling the conduction/non-conduction state of the variable threshold voltage transistor $TR_n$ constituting the program-verify circuit is outputted. In other words, the output portion of the D/A converter 10 outputs a potential which is to change the apparent threshold voltage of the variable threshold voltage transistor $TR_n$.

TABLE 2

| Input data | Output potential (volt) |
|---|---|
| (1,1) | (3/4) $V_{dd}$ |
| (1,0) | (2/4) $V_{dd}$ |
| (0,1) | (1/4) $V_{dd}$ |
| (0,0) | (0/4) $V_{dd}$ = 0 |

In the above case, $V_B$ in the above expression (1) corresponds to a potential outputted from the output portion of the D/A converter 10, and $V_A$ in the above expression (1) corresponds to an output potential of the bit line BL. When the potential outputted from the output portion of the D/A converter 10 is high, the variable threshold voltage transistor $TR_n$ is conducted even if a low potential is inputted to the input gate electrode 47A, in other words, even if the output potential from the bit line BL is low. That is, the apparent threshold voltage of the variable threshold voltage transistor $TR_n$ changes depending upon the potential outputted from the output portion of the D/A converter 10. Preferably, $C_B$, $C_{TOTAL}$, $V_{th-n}$, and so forth, are designed such that the relationship between the potential outputted from the output portion of the D/A converter 10 and the potential threshold value $V_{th-n}^*$ of the variable threshold voltage transistor $TR_n$ satisfies the following expression (3).

$$(C_B/C_{TOTAL})(3/4)V_{dd} > V_{th-n}^* > (C_B/C_{TOTAL})(2/4)V_{dd} \quad (3)$$

For starting the writing of data into the NOR type memory cell, first, the reset transistor $T_{RST-n}$ in the latch circuit 20 is turned on to reset data in the latch circuit 20, and initial data is latched in the latch circuit 20. That is, the node $N_1$ in FIG. 1 comes into an "H" state (i.e., $V_{dd}$ volt), and the node $N_2$ comes into an "L" state (i.e., 0 volt).

Then, the program-cycle is performed. That is, a transistor $TR_{PROG}$ for programming is turned on, and the transistor $TR_{VERIFY}$ for verification is turned off. In this state, the initial data ("H" state) latched in the latch circuit 20 is converted to a high voltage (e.g., 10 volts) signal $V_{pp}$ with the voltage conversion circuit 30 and is outputted to the bit line BL in the form of pulses. For example, 12 volts is applied to the control gate of the memory element. In this manner, hot electrons generated in the drain region of the memory element are injected into the floating gate, and the threshold voltage $V_{th}$ of the memory element is increased.

When data (1,1) is written in the memory element, the potential outputted from the output portion of the D/A converter 10 is (3/4)$V_{dd}$, so that the expression (3) is satisfied. Therefore, the variable threshold voltage transistor $TR_n$ is brought into a conduction state, so that the initial data ("H" state) retained in the latch circuit 20 is inverted to come into an "L" state. That is, the potential of the latch circuit 20 on the bit line side is brought into 0 volt. Therefore, no data is written in the memory element, and the threshold voltage $V_{th-11}$ in a data-erased state is retained.

When data (1,0), (0,1) or (0,0) is written in the memory element, the expression (3) is satisfied since the potential outputted from the output portion of the D/A converter 10 is (2/4)$V_{dd}$ or lower, so that the variable threshold voltage transistor $TR_n$ is in a non-conduction state. Therefore, the potential of the latch circuit 20 on the bit line side (potential in the node $N_1$) remains to be the initial data ("H" state), and the data is written in the memory element in the form of pulses. That is, the threshold voltage $V_{th}$ of the memory element is increased.

Then, the verify-cycle is performed. That is, similarly to the performance of readout, a current is flowed in the bit line BL, and the resultant bit line output potential ($V_{BL}$) is applied to one input gate electrode 47A of the variable threshold voltage transistor $TR_n$ by turning off the transistor $TR_{PROG}$ for programming and turning on the transistor $TR_{VERIFY}$ for verification. By inputting the potential outputted from the output portion of the D/A converter 10 to the other input gate electrode 47B of the variable threshold voltage transistor $TR_n$, the variable threshold voltage transistor $TR_n$ is controlled to be brought from a non-conduction state to a conduction state when the bit line output potential $V_{BL}$ reaches a predetermined potential.

It is supposed that the bit line output potential $V_{BL}$ in the verify-cycle at the point of time when data (1,0) has been written in the memory element is $V_{BL-10}$, that the bit line output potential $V_{BL}$ at the point of time when data (0,1) has been written in the memory element is $V_{BL-01}$, and that the bit line output potential $V_{BL}$ at the point of time when data (0,0) has been written in the memory element is $V_{BL-00}$. The memory cell is constitutionally designed so as to satisfy $V_{BL-10} < V_{BL-01} < V_{BL-00}$. Further, $C_A$, $C_B$, $C_{TOTAL}$, $V_{th-n}^*$, and so forth, are designed such that the relationship between the potential $\phi_F$ of the floating electrode 45 and the potential threshold value $V_{th-n}^*$ of the variable threshold voltage transistor $TR_n$ satisfies the following expressions (4-1), (4-2) and (4-3).

$$\phi_F = \{C_A V_{BL-10} + C_B(2/4)V_{dd}\}/C_{TOTAL} > V_{th-n}^* \quad (4\text{-}1)$$

$$\phi_F = \{C_A V_{BL-01} + C_B(1/4)V_{dd}\}/C_{TOTAL} > V_{th-n}^* \quad (4\text{-}2)$$

$$\phi_F = \{C_A V_{BL-00} + C_B(0/4)V_{dd}\}/C_{TOTAL} > V_{th-n}^* \quad (4\text{-}3)$$

For example, when data (1,0) is written in the memory element, and when the potential to be applied to one input gate electrode 47A of the variable threshold voltage transistor $TR_n$ has not yet reached $V_{BL-10}$ in the verify-cycle, the expression (4-1) is not satisfied, so that the variable threshold voltage transistor $TR_n$ remains in a non-conduction state.

Therefore, the verify-cycle is switched to the program-cycle, the initial data ("H" state) latched in the latch circuit 20 is converted to a high voltage (e.g., 10 volts) signal $V_{pp}$ with the voltage conversion circuit 30, and is re-outputted to the bit line BL in the form of pulses, whereby the threshold voltage $V_{th}$ of the memory element is increased. Then, the verify-cycle is performed.

In the verify-cycle, when the potential inputted to one input gate electrode 47A of the variable threshold voltage transistor $TR_n$ reaches $V_{BL-10}$, the expression (4-1) is satisfied, so that the variable threshold voltage transistor $TR_n$ comes into a conduction state. As a result, the initial data ("H" state) retained in the latch circuit 20 is inverted into an "L" state, and further writing of data into the memory element is inhibited.

Writing of data (1,0) or data (0,0) in the memory element is also performed similarly.

Figure 3A:
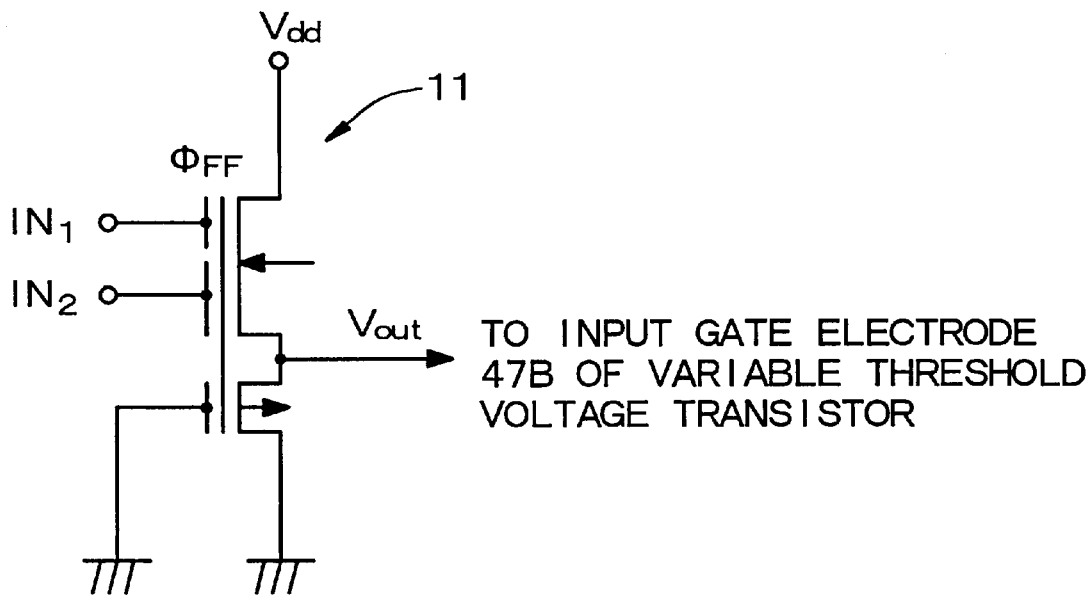
FIG. 3A is an equivalent circuit diagram showing an example in which a digital/analog converter comprises a variable threshold voltage field-effect transistor, and FIG. 3B schematically shows output characteristics thereof.

The D/A converter can be constituted of a conventional D/A converter, while it is preferred to be constituted of a D/A converter of an n-channel type variable threshold voltage transistor formed of a neuron MOS transistor, for simplification of the configuration, simplification of the circuit and decreasing of occupation area of the circuit. FIG. 3A shows a circuit diagram of the above D/A converter 11. The D/A converter 11 comprises source/drain regions, a channel forming region between the source/drain regions, one floating electrode formed on a first insulating film formed on the channel forming region, and a plurality of input gate electrodes (two input gate electrodes in Example 1) formed on a second insulating film formed on the floating electrode. Preferably, the D/A converter 11 is a complementary neuron MOS transistor having a p-channel type neuron MOS transistor as an active load and the above n-channel type neuron MOS transistor and is formed as a source follower circuit. When the drain region of the n-channel type neuron MOS transistor is connected to a power source voltage $V_{dd}$, and when the source region of the n-channel type neuron MOS transistor is used as an output terminal, the voltage $V_{out}$(potential for controlling the conduction/non-conduction state of the variable threshold voltage transistor $TR_n$ constituting the program-verify circuit) which is outputted through the above output terminal is as follows. $\phi_{FF}$ and $V_{th}^{**}$ are a potential of the floating electrode in the neuron MOS transistor constituting the D/A converter 11 and a potential of the floating electrode when a channel is induced in the channel forming region so that the neuron MOS transistor is brought into a conduction state, respectively.

$$V_{out} = \phi_{FF} - V_{th}^{**} \quad (5)$$

Figure 3B:
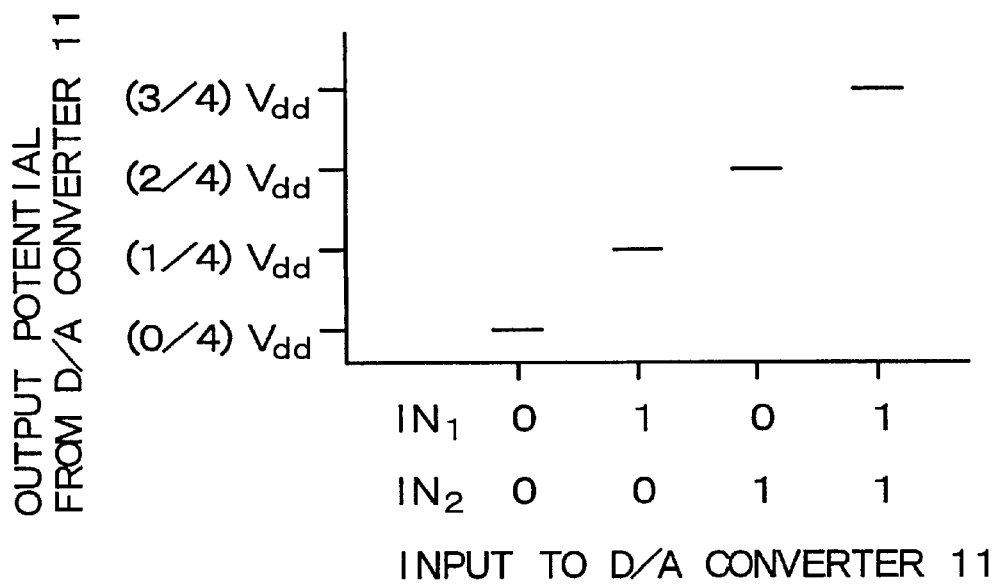

When the transistor is designed so as to attain $V_{th}^{**} = 0$ volt, $V_{out} = \phi_{FF}$, and a voltage corresponding to binary data of "0" data and "1" data inputted to the input gate electrodes of the D/A converter 11 is converted with the D/A converter 11 and outputted as $V_{out}$ and inputted to the other input gate electrode 47B of the variable threshold voltage transistor $TR_n$. FIG. 3B schematically shows output characteristics of the D/A converter 11, and a multi-valued potential in the form of steps is outputted from the D/A converter 11.

Example 2

In Example 1, the program-verify circuit of the present invention is applied to the NOR type memory cell. In Example 2, the program-verify circuit of the present invention will be applied to a NAND type memory cell.

Figure 6:
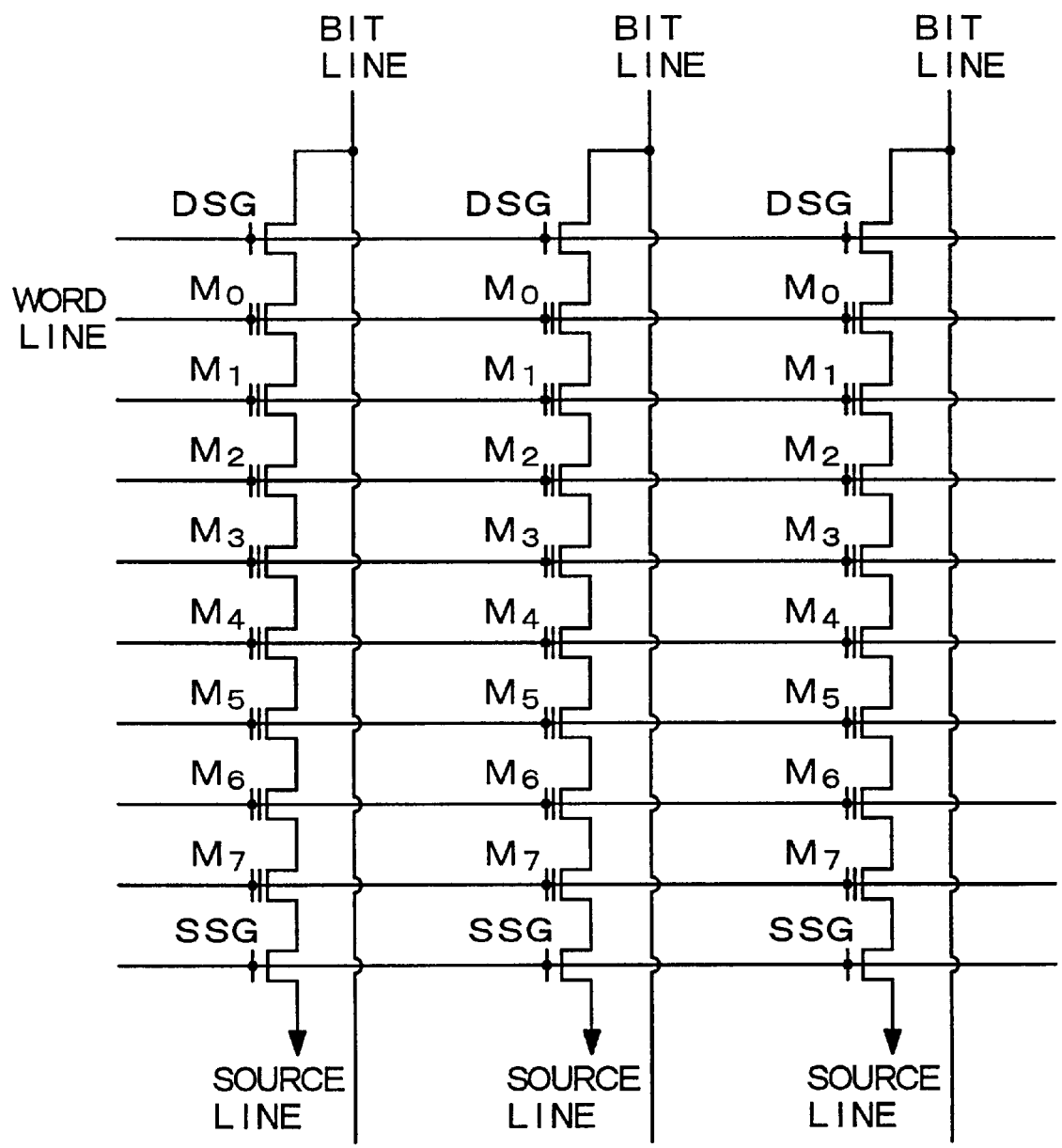
FIG. 6 shows a cell-array structure of a NAND type memory cell.
Figure 7:
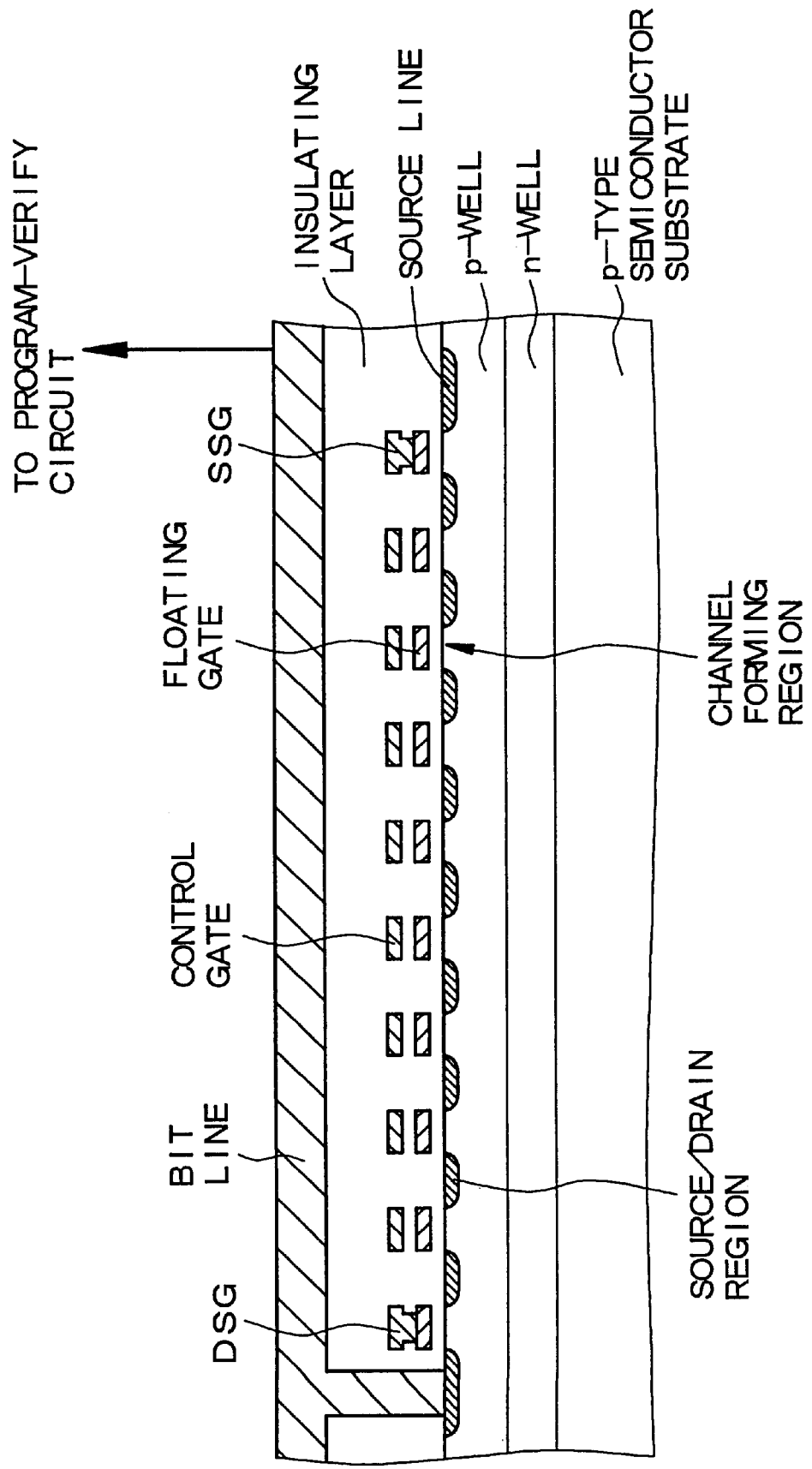
FIG. 7 is a schematic partial cross-sectional view of memory elements constituting the NAND type memory cell.

As FIG. 6 shows a cell-array structure and as FIG. 7 shows a schematic partial cross-sectional view thereof, the NAND type memory cell is constituted of a plurality of memory elements $M_0$ to $M_7$, each of which is formed in a substrate (more specifically, in a p-type semiconductor substrate or in a p-type well) and has source/drain regions, a channel forming region, a floating gate and a control gate. In the NAND type memory cell, one of the source/drain regions of the memory element is used in common as the other of source/drain regions of an adjacent memory element, whereby a plurality of memory elements are connected in series. The memory element positioned in one end of the NAND type memory cell is connected to a bit line through a first selection transistor DSG, and the memory element positioned in the other end of the NAND type memory cell is connected to a common source line through a second selection transistor SSG. A plurality of NAND type memory cells are arranged in a column direction, and the control gate is connected to a word line arranged in a row direction.

The performance of writing of data into the memory element in the NAND type memory cell will be outlined below.

In the NAND type memory cell, data writing is started in the memory elements from the memory element $M_7$ farthest from the bit line BL. In the program-cycle, a high potential (e.g., about 20 volts) is applied to a control gate of a memory element where data is to be written (to be referred to as "selected memory element" for convenience hereinafter).

An intermediate potential (e.g., about 10 volts) is applied to memory elements (to be referred to as "non-selected memory elements" for convenience hereinafter) other than the above selected memory element. Further, for example, 0 volt is applied to the bit line BL. And, the first selection transistor DSG is brought into a conduction state and the second selection transistor SSG is brought into a non-conduction state, whereby the potential of the bit line BL is transferred to the source/drain regions of the memory elements. In the selected memory element, electrons are injected from the channel forming region to the floating gate due to a Fowler-Nordheim tunneling phenomenon on the basis of a potential difference between the control gate and the channel forming region. As a result, the threshold voltage of the selected memory element is shifted toward a positive direction from an initial negativity, and data is written in the selected memory element. On the other hand, in the non-selected memory elements, no large potential difference is caused between the control gate and the channel forming region, and no electrons are injected from the channel forming region to the floating gate. As a result, the threshold voltage of each non-selected memory element shows no change from its initial value, and the initial data is retained in each non-selected memory element. When multi-valued data is stored in the memory element, it is sufficient to increase the threshold voltage $V_{th}$ of the memory element to a predetermined value by applying a voltage (e.g., 0 volt) to the bit line BL in the form of pulses.

In the verify-cycle, similar to the performance of readout, it is evaluated whether or not the threshold voltage $V_{th}$ of each memory element $M_0$ to $M_7$ is a predetermined value. Specifically, the potential $V_{BL}$ of the bit line BL is re-set, for example, at 0 volt, and then the bit line BL is brought into a floating state. A predetermined potential is applied to the common source line to charge the bit line BL through the memory element. Potentials to be applied to gate electrodes of the first selection transistor DSG and the second selection transistor SSG and to the control gate of each memory element are controlled such that the potential of the above-charged bit line BL is determined by the threshold voltage $V_{th}$ of the selected memory element. More specifically, the memory cell configuration is designed such that the potential of the bit line BL is a value obtained by deducting the threshold voltage $V_{th}$ of the selected memory element from the voltage $V_{select}$ applied to the control gate of the selected memory element ($V_{select}-V_{th}$). When the threshold voltage $V_{th}$ of the memory element comes to be a predetermined value, the performance of writing is finished. When the threshold voltage $V_{th}$ of the memory element has not yet reached the predetermined value, the program-cycle is re-performed. In this manner, the program-cycle and the verify-cycle are repeated, the value of the threshold voltage $V_{th}$ of the memory element increases as the number of times of voltage pulses applied to the bit line BL increases, and finally, reaches the predetermined value.

In the performance of writing in the NOR type memory cell explained in Example 1, the potential to be applied to the bit line BL is approximately 10 volts. In the NAND type memory cell, however, the potential to be applied to the bit line BL is required to be set at 0 volt.

Figure 9A:
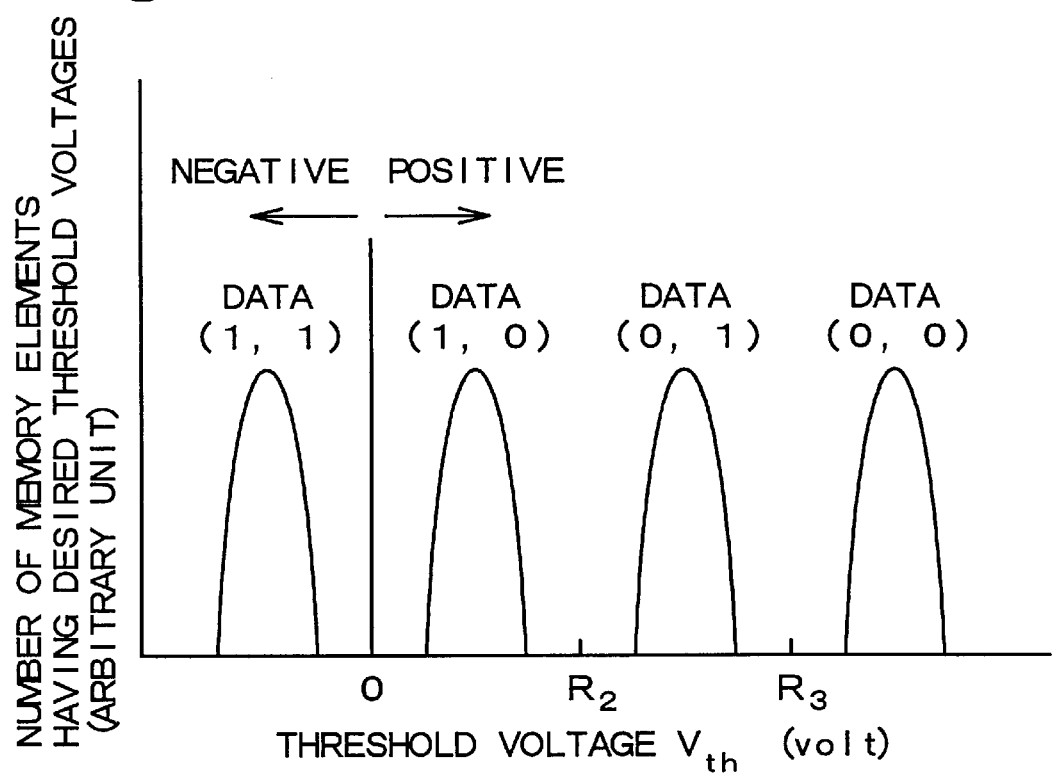
FIG. 9A schematically shows a distribution of threshold voltages $V_{th}$ of memory elements of the NAND type memory cell, and FIG. 9B schematically shows a distribution of bit line output potentials.
Figure 9B:
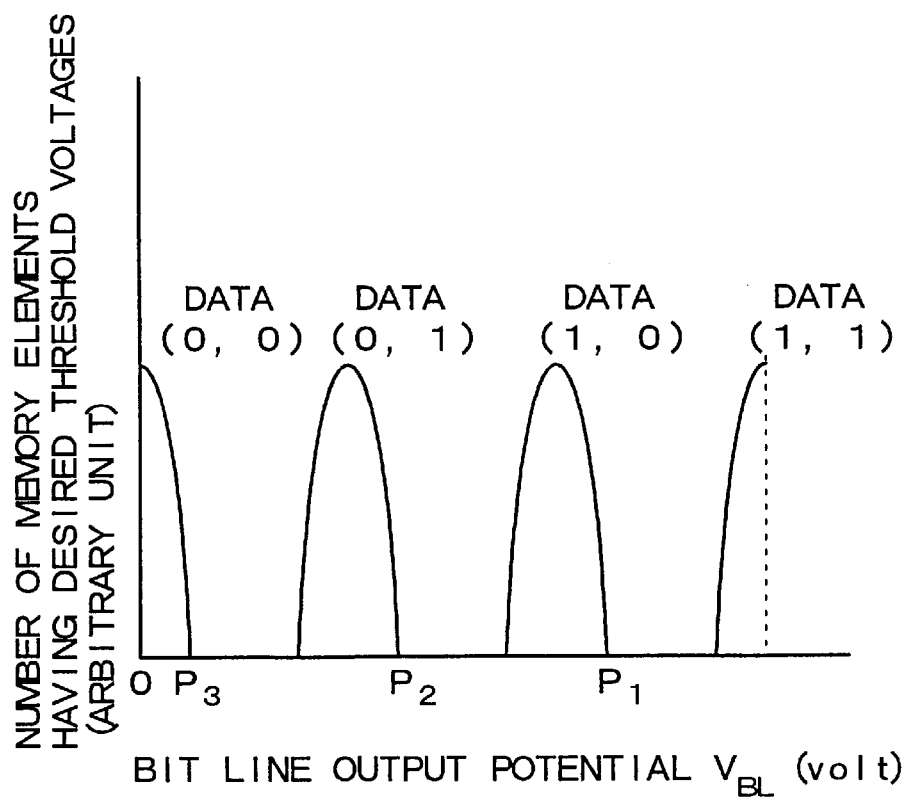

FIG. 9A shows a distribution of the threshold voltages $V_{th}$ of the memory elements. In the NAND type memory cell, the threshold voltage $V_{th-11}$ of the memory element storing data (1,1) in a data-erased state is distributed in a negative potential, and the threshold voltages $V_{th-10}$, $V_{th-01}$ and $V_{th-00}$ of the memory elements storing data (1,0), data (0,1) and data (0,0) are distributed in positive potentials. Further, there is a relationship of $V_{th-10}<V_{th-01}<V_{th-00}$. FIG. 9B shows a distribution of the bit line output potentials $V_{BL}$ in the verify-cycle. The bit line output potentials $V_{BL-11}$, $V_{BL-10}$, $V_{BL-01}$ and $V_{BL-00}$ in data (1,1), data (1,0), data (0,1) and data (0,0) have a relationship of $V_{BL-00}<V_{BL-01}<V_{BL-10}<V_{BL-11}$. For example, the value of $V_{BL-11}$ is ($V_{select}-V_{th-11}$).

Figure 8:
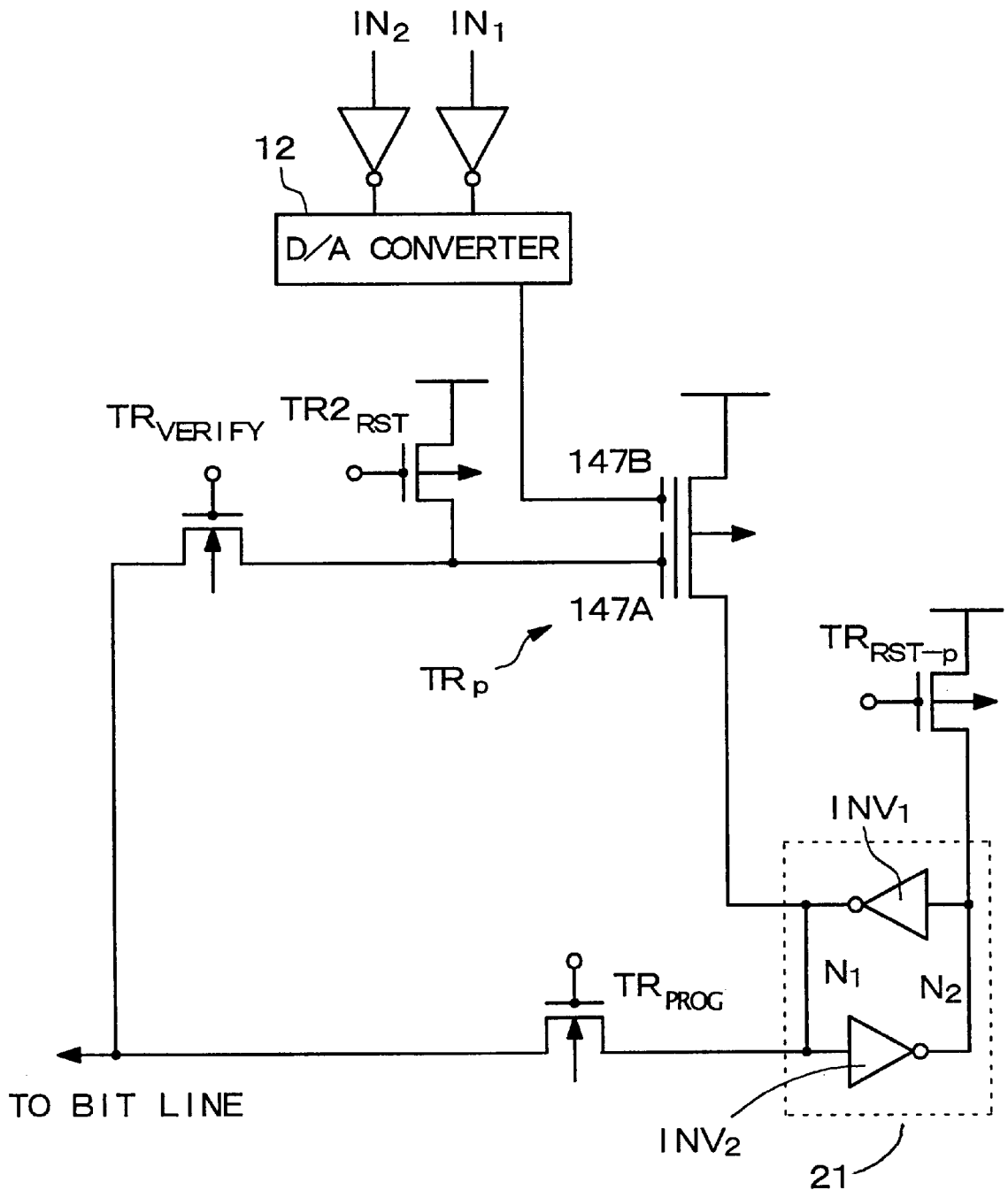
FIG. 8 is a circuit diagram of a program-verify circuit in Example 2.

FIG. 8 shows a circuit diagram of the program-verify circuit in Example 2. Elements constituting the program-verify circuit are in principle the same as those constituting the program-verify circuit explained in Example 1. However, when a so-called self-boost technique is employed, the feed potential to the bit line BL when writing of data into the memory element is inhibited can be $V_{CC}$, and therefore, differing from Example 1, it is no longer required to provide the voltage conversion circuit.

The D/A converter 12 can be structured similarly to the D/A converter 10 or the D/A converter 11 in Example 1, while conventional CMOS inverters are disposed in a stage before the D/A converter 12. That is, voltages, which are obtained by inverting voltages corresponding to binary data of "0" data and "1" data with the CMOS inverters, are inputted to two input portions of the D/A converter 12 through input lines $IN_1$ and $IN_2$. The following Table 3 shows one example of relationship between input data inputted to the input portions of the D/A converter 12 and an output potential outputted from the output portion of the D/A converter 12. The D/A converter 12 outputs a multi-valued potential in the form of steps. That is, the D/A converter 12 outputs a potential for controlling the conduction/non-conduction state of the variable threshold voltage transistor $TR_p$ constituting the program-verify circuit. In other words, a potential for changing the apparent threshold voltage of the variable threshold voltage transistor $TR_p$ is outputted from the output portion of the D/A converter 12.

TABLE 3

| Input data | Output potential (volt) |
| --- | --- |
| (1,1) | (0/4) $V_{dd}$ = 0 |
| (1,0) | (1/4) $V_{dd}$ |
| (0,1) | (2/4) $V_{dd}$ |
| (0,0) | (3/4) $V_{dd}$ |

Differing from Example 1, the variable threshold voltage transistor is a p-channel type variable threshold voltage transistor $TR_p$, and a reset transistor $TR_{RST-P}$ is also a p-channel type. The variable threshold voltage transistor $TR_p$ is connected to the latch circuit 21 on the bit line side, and the reset transistor $TR_{RST-P}$ is connected to the latch circuit 21 on the side opposite to the bit line. The latch circuit 21 comprises a combination of two conventional CMOS inverters, and an output of one CMOS inverter $INV_1$ is connected to the bit line BL, to the variable threshold voltage transistor $TR_p$ and to an input portion of the other CMOS inverter $INV_2$. An output portion of the other CMOS inverter $INV_2$ is connected to the input portion of the former CMOS inverter $INV_1$ and to the reset transistor $TR_{RST-P}$.

The p-channel type variable threshold voltage transistor $TR_p$ can be substantially structurally the same as the variable threshold voltage transistor $TR_n$ explained in Example 1 except that the conductivity type is reverse. One input gate electrode 147A of the variable threshold voltage transistor $TR_p$ is connected to a memory cell through the bit line, and the other input gate electrode 147B of the variable threshold voltage transistor $TR_p$ is connected to the output portion of the D/A converter 12. The latch circuit 21 is connected to the source region of the variable threshold voltage transistor $TR_p$ and to the memory cell through the bit line BL. A second reset transistor $TR2_{RST}$ of p-channel type is provided between a transistor $TR_{VERIFY}$ for verification and one input gate electrode 147A of the variable threshold voltage transistor $TR_p$.

When a channel is induced in a channel forming region 43 of the p-channel type variable threshold voltage transistor $TR_p$ to bring the variable threshold voltage transistor $TR_p$ from a non-conduction state to a conduction state, the potential of the floating electrode 45 (to be referred to as "potential threshold value of variable threshold voltage transistor" hereinafter) is described as $V_{th-p}*$. In this case, when the relationship between the potential $\phi_F$ of t he floating electrode 45 and the potential threshold value $V_{th-p}*$ satisfies the following expression (6), the variable threshold voltage transistor $TR_p$ is reliably conducted.

$$0 \leq \phi_F < V_{th-p}* \tag{6}$$

$V_B$ in the expression (1) corresponds to the potential outputted from the output portion of the D/A converter 12, and $V_A$ in the expression (1) corresponds to the output potential of the bit line BL. Therefore, when the potential outputted from the output portion of the D/A converter 12 is low, the variable threshold voltage transistor $TR_p$ is conducted even if a high potential is inputted to the input gate electrode 147A, in other words, even if the output potential from the bit line BL is high. That is, the apparent threshold voltage of the variable threshold voltage transistor $TR_p$ changes depending upon the potential outputted from the output portion of the D/A converter 12.

For starting the writing of data in the NAND type memory cell, first, the reset transistor $T_{RST-p}$ of the latch circuit 21 is turned on to reset data in the latch circuit 21, and initial data is latched in the latch circuit 21. That is, the node $N_1$ in FIG. 8 comes into an "L" state (i.e., 0 volt) and the node $N_2$ comes into an "H" state (i.e., $V_{dd}$ volt).

Then, the program-cycle is performed. That is, a transistor $TR_{PROG}$ for programming is turned on, and the transistor $TR_{VERFY}$ for verification is turned off. In this state, the initial data ("L" state) latched in the latch circuit 21 is outputted to the bit line BL in the form of pulses. For example, 20 volts is applied to the control gate of the memory element. In this manner, electrons are injected from the channel forming region to the floating gate due to a Fowler-Nordheim tunneling phenomenon, and the threshold voltage $V_{th}$ of the memory element is increased.

When data (1,1) is written in the memory element, the second reset transistor $TR2_{RST}$ is brought into a non-conduction state. The potential outputted from the output portion of the D/A converter 12 is $(0/4)V_{dd}$ (=0 volt), so that the expression (6) is satisfied. Therefore, the variable threshold voltage transistor $TR_p$ is brought into a conduction state. That is, the initial data ("L" state) retained in the latch circuit 21 is inverted into an "H" state, and the potential of the latch circuit 21 on the bit line side comes to be $V_{dd}$ volt. Therefore, the node $N_1$ in FIG. 8 comes into an "H" state and the node $N_2$ comes into an "L" state, so that no data is written in the memory element and the threshold voltage $V_{th-11}$ in a data-erased state is retained.

When data (1,0), (0,1) or (0,0) is written in the memory element, the second reset transistor $TR2_{RST}$ is brought into a conduction state, whereby the variable threshold voltage transistor $TR_p$ is brought into a non-conduction state, the potential of the latch circuit 21 on the bit line side (potential in the node $N_1$) remains in the initial data ("L" state), and 0 volt is outputted to the bit line BL. As a result, electrons are injected into the floating gate of the memory element in the form of pulses, and the threshold voltage $V_{th}$ of the memory element is increased.

Then, the verify-cycle is performed. That is, similarly to the performance of readout, a current is flowed in the bit line BL, and the resultant bit line output potential ($V_{BL}$) is applied to one input gate electrode 147A of the variable threshold voltage transistor $TR_p$ by turning off the transistor $T_{PROG}$ for programming and turning on the transistor $TR_{VERIFY}$ for verification.

It is supposed that the bit line output potential $V_{BL}$ in the verify-cycle at the point of time when data (1,0) has been written in the memory element is $V_{BL-10}$, that the bit line output potential $V_{BL}$ at the point of time when data (0,1) has been written in the memory element is $V_{BL-01}$, and that the bit line output potential $V_{BL}$ at the point of time when data (0,0) has been written in the memory element is $V_{BL-00}$. The memory cell is constitutionally designed so as to satisfy $V_{BL-10} < V_{BL-01} < V_{BL-00}$. Further, $C_A$, $C_B/C_{TOTAL}$, $V_{th-p}*$, and so forth, are designed such that the relationship between the potential $\phi_F$ of the floating electrode 45 and the potential threshold value $V_{th-p}$ of the variable threshold voltage transistor $TR_p$ satisfies the following expressions (7-1), (7-2) and (7-3).

$$\phi_F = \{C_A V_{BL-10} + C_B(1/4)V_{dd}\}/C_{TOTAL} < V_{th-p}* \tag{7-1}$$

$$\phi_F = \{C_A V_{BL-01} + C_B(2/4)V_{dd}\}/C_{TOTAL} < V_{th-p}* \tag{7-2}$$

$$\phi_F = \{C_A V_{BL-00} + C_B(3/4)V_{dd}\}/C_{TOTAL} < V_{th-p}* \tag{7-3}$$

For example, when data (1,0) is written in the memory element, and when the potential applied to one input gate electrode 147A of the variable threshold voltage transistor $TR_p$ in the verify-cycle exceeds $V_{BL-10}$, the expression (7-1) is not satisfied, so that the variable threshold voltage transistor $TR_p$ remains in a non-conduction state.

Therefore, the verify-cycle is switched to the program-cycle, and the initial data ("L" state) latched in the latch circuit 21 is re-outputted to the bit line BL in the form of pulses, whereby the threshold voltage $V_{th}$ of the memory element is increased. Then, the verify-cycle is performed.

When the potential applied to one input gate electrode 147A of the variable threshold voltage transistor $TR_p$ is $V_{BL-10}$ or lower in the verify-cycle, the expression (7-1) is satisfied, and the variable threshold voltage transistor $TR_p$ is brought into a conduction state. As a result, the initial data ("L" state) retained in the latch circuit 21 is inverted into an "H" state, and further writing of data into the memory element is inhibited.

Writing of data (1,0) or data (0,0) in the memory element is also performed similarly.

Figure 10:
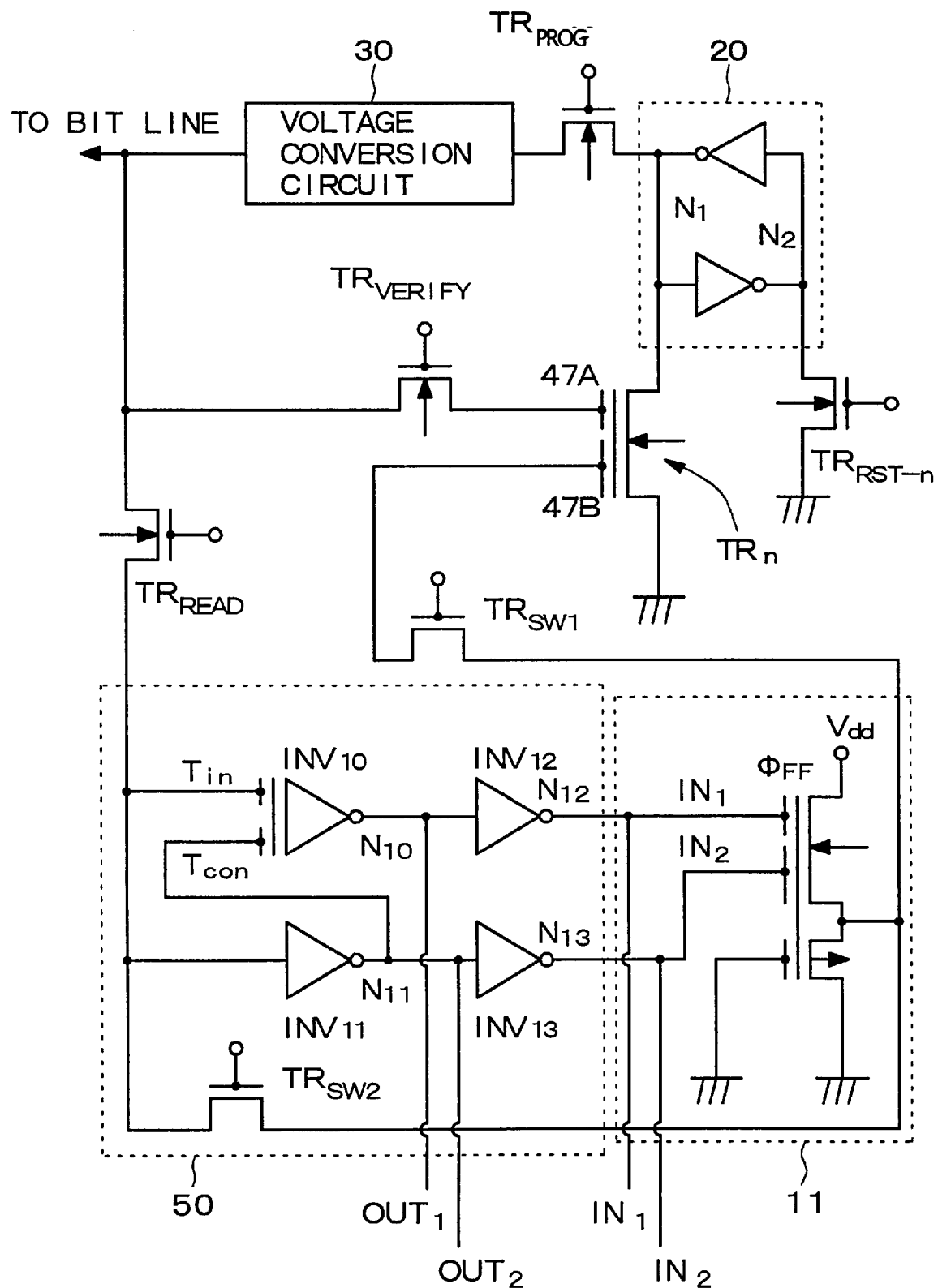
FIG. 10 is a circuit diagram of a program-verify circuit in Example 3.

Example 3 shown in FIG. 10

In Example 3, a read circuit is added to the program-verify circuit of the present invention explained in Example 1. The read circuit shown in FIG. 10 comprises an analog/digital converter ("A/D converter" hereinafter) 50 which is a neuron MOS transistor and a D/A converter 11 which is the same as that explained already. The A/D converter 50 is disclosed in JP-A-7-200513.

Figure 11A:
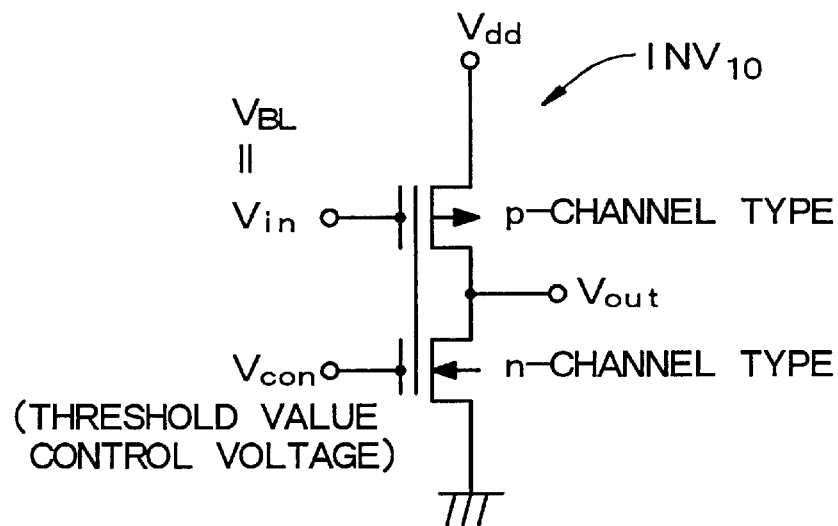
FIG. 11A is a circuit diagram of a neuron MOS inverter.

The A/D converter 50 of which the circuit diagram is shown in FIG. 10 comprises a variable threshold voltage inverter $INV_{10}$ having two input portions ($T_{in}$, $T_{con}$) and one output portion ($T_{out}$) shown in FIG. 11A, a first inverter $INV_{11}$, a second inverter $INV_{12}$ and a third inverter $INV_{13}$ which are conventional CMOS inverters. A bit line output potential $V_{BL}$ is inputted to one input portion $T_{in}$ of the variable threshold voltage inverter $INV_{10}$ and to an input portion of the first inverter $INV_{11}$. The output portion of the first inverter $INV_{11}$ is connected to the other input portion $T_{con}$ of the variable threshold voltage inverter $INV_{10}$ and to an input portion of the third inverter $INV_{13}$. The output portion $T_{out}$ of the variable threshold voltage inverter $INV_{10}$ is connected to an input portion of the second inverter $INV_{12}$. Output portions of the second inverter $INV_{12}$ and the third inverter $INV_{13}$ are connected to two input gate electrodes $IN_1$ and $IN_2$ of the D/A converter 11 constituted of the neuron MOS transistor explained in Example 1, respectively. Output lines $OUT_1$ and $OUT_2$ of the D/A converter 11 are connected to the output portion $T_{out}$ of the variable threshold voltage inverter $INV_{10}$ and the output portion of the first inverter $INV_{11}$, respectively. An output of the D/A converter 11 is fed back to one input portion $T_{in}$ of the variable threshold voltage inverter $INV_{10}$ and to the input portion of the first inverter $INV_{11}$. Further, the output portion of the D/A converter 11 is connected to the other input gate electrode 47B of the variable threshold voltage transistor $TR_n$.

Prior to the explanation of performance of the read circuit in Example 3, the 2-input type variable threshold voltage inverter $INV_{10}$ using a neuron MOS transistor shown in FIG. 11A is outlined first.

Figure 11B:
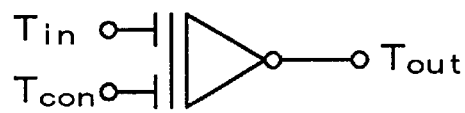
FIG. 11B is a skeleton diagram thereof.

The above variable threshold voltage inverter $INV_{10}$, is constituted of a neuron CMOS transistor which is a combination of a p-channel type MOS transistor and an n-channel type MOS transistor. A bit line output potential $V_{BL}$ is inputted to the input gate electrode of the p-channel type MOS transistor corresponding to one input portion $T_{in}$ of the variable threshold voltage inverter $INV_{10}$. A threshold value control voltage $V_{con}$ is inputted to the input gate electrode (threshold voltage control gate electrode) of the n-channel type MOS transistor corresponding to the other input portion $T_{con}$ of the variable threshold voltage inverter $INV_{10}$. FIG. 11B shows a skeleton diagram of the variable threshold voltage inverter. The threshold value control voltage $V_{con}$ is an output potential of the first inverter $INV_{11}$.

Figure 11C:
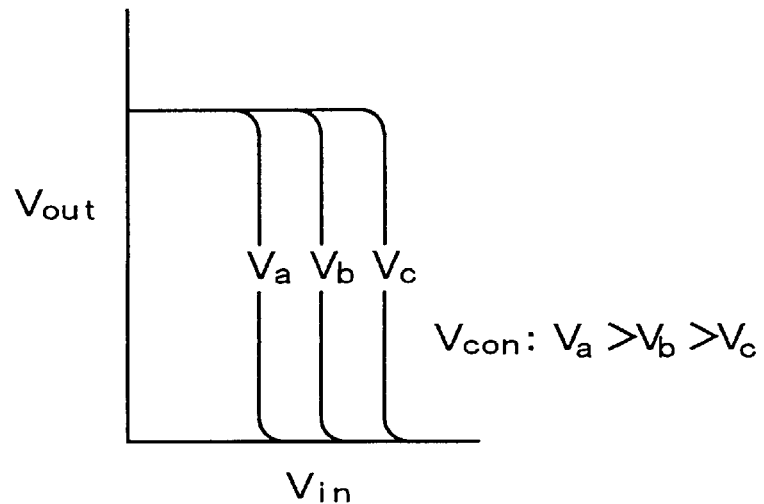
FIG. 11C shows output voltage characteristics thereof.

In a conventional CMOS inverter which is a combination of a p-channel type MOS transistor and a n-channel type MOS transistor, the threshold value of logical inversion is determined when the transistors are produced. On the other hand, in the variable threshold voltage inverter $INV_{10}$, the threshold value of logical inversion can be set at an arbitrary voltage by changing the threshold value control voltage $V_{con}$ to be applied to the threshold voltage control gate electrode. That is, the threshold value of the logical inversion can be changed depending upon the output potential of the first inverter $INV_{11}$. FIG. 11C shows output voltage characteristics, provided that the threshold value control voltage $V_{con}$ ($V_a$, $V_b$, $V_c$) has a relationship of $V_a > V_b > V_c$. With an increase in the threshold value control voltage $V_{con}$, the threshold value of the logical inversion decreases. That is because the potential $\phi_F$ of the floating electrode of the neuron MOS inverter increases with an increase in the threshold value control voltage $V_{con}$.

The performance of the read circuit will be explained below. In the performance of readout, a first transistor $TR_{sw1}$ for switching, a transistor $TR_{PROG}$ for programming and a transistor $TR_{VERIFY}$ for verification are turned off, and a transistor $TR_{READ}$ for reading and a second transistor $TR_{SW2}$ for switching are turned on. A current is flowed in the bit line, and the resultant bit line output potential ($V_{BL}$) is inputted to one input portion $T_{in}$ of the variable threshold voltage inverter $INV_{10}$ and to the first inverter $INV_{11}$. The first inverter $INV_{11}$, is designed such that the first inverter $INV_{11}$ outputs "H" when the bit line output potential $V_{BL}$ is less than $(V_{BL-10}+V_{BL-01})/2$ and that it outputs "L" when the bit line output potential $V_{BL}$ is equal to, or greater than, $(V_{BL-10}+V_{BL-01})/2$. That is, the first inverter $INV_{11}$ is designed such that the first inverter $INV_{11}$, outputs "H" when the bit line output potential $V_{BL}$ corresponds to data (1,1) and (1,0) and that it outputs "L" when the bit line output potential $V_{BL}$ corresponds to data (0,1) and (0,0).

The first inverter $INV_{11}$, causes an inversion depending upon the bit line output potential $V_{BL}$. The output of the first inverter $INV_{11}$, is inputted to the other input portion $T_{con}$ (threshold voltage control gate electrode) of the variable threshold voltage inverter $INV_{10}$ and is inputted to the third inverter $INV_{13}$.

Figure 12A:
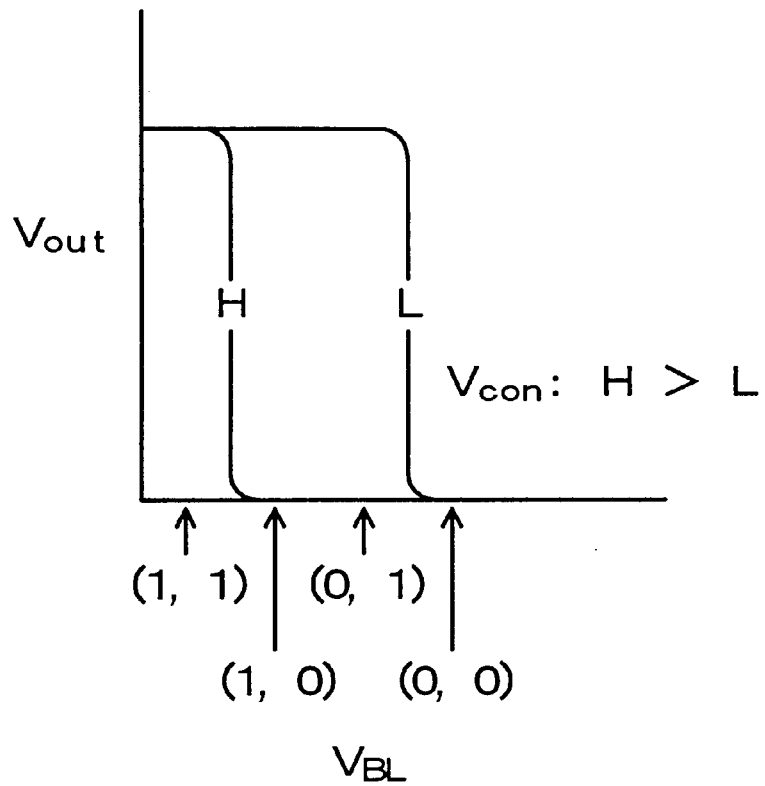
FIG. 12A schematically shows an inversion state in a variable threshold voltage inverter $INV_{10}$, and FIG. 12B schematically shows an output potential of a D/A converter incorporated into a read circuit.

Depending upon a $V_{con}$ potential ("H" or "L", the output potential of the first inverter $INV_{11}$) inputted to the other input portion $T_{con}$ (threshold voltage control gate electrode), and depending upon the bit line output potential $V_{BL}$ inputted to one input portion $T_{in}$, the variable threshold voltage inverter $INV_{10}$, causes an inversion or does not cause any inversion, and it outputs a potential "H" or "L". FIG. 12A schematically shows the above state. In FIG. 12A, (1,1), (1,0), (0,1) and (0,0) on the axis of abscissas represent the bit line output potentials $V_{BL}$ which appear in the bit line when data in the memory element is read. Table 4 shows a relationship between each of the nodes $N_{11}$, $N_{12}$ and $N_{13}$ in FIG. 10 and the output potential of the D/A converter 11.

TABLE 4

| Data corresponding to bit line output potential | Node | | | | D/A converter output |
|---|---|---|---|---|---|
| | $N_{11}$ | $N_{10}$ | $N_{12}$ | $N_{13}$ | |
| (1,1) | H | H | L | L | (0/4) $V_{dd}$ |
| (1,0) | H | L | H | L | (1/4) $V_{dd}$ |
| (0,1) | L | H | L | H | (2/4) $V_{dd}$ |
| (0,0) | L | L | H | H | (3/4) $V_{dd}$ |

Figure 12B:
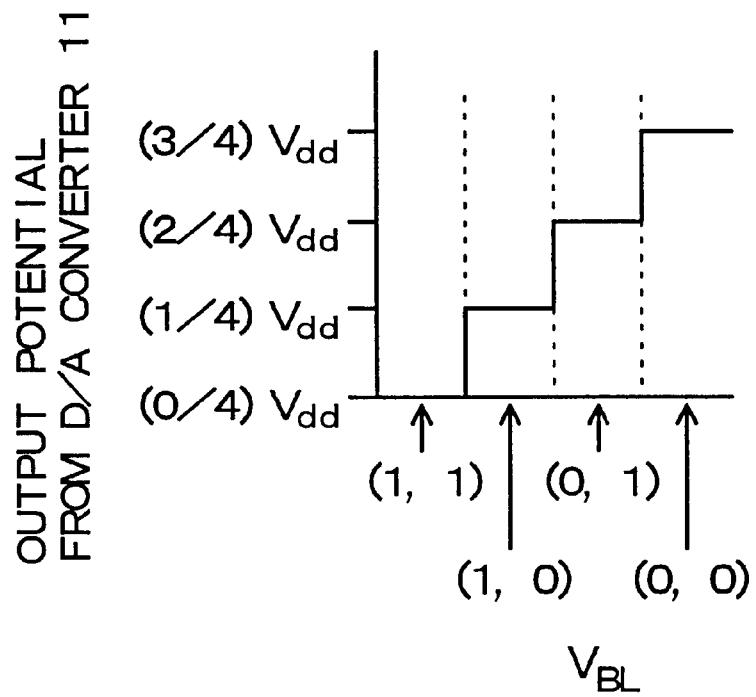

Meanwhile, the second transistor $TR_{SW2}$ for switching is in an on-state, the output of the D/A converter 11 is fed back to one input portion $T_{in}$ of the variable threshold voltage inverter $INV_{10}$ and to the input portion of the first inverter $INV_{11}$, whereby outputs from the A/D converter 50 to output lines $OUT_1$ and $OUT_2$ are converted to binary data, and further, the output potential of the D/A converter 11 is focused to four discrete stable points depending upon the level of the inputted bit line output potential $V_{BL}$, as shown in FIG. 12B. Even if the bit line output potential $V_{BL}$ varies, therefore, the bit line output potential $V_{BL}$ is normalized to a fixed potential (0/4)$V_{dd}$, (1/4)$V_{dd}$, (2/4)$V_{dd}$ or (3/4)$V_{dd}$ so long as the bit line output potentials $V_{BL}$ corresponding to these data do not overlap, so that readout with a margin can be performed.

The program-cycle and the verify-cycle can be performed similarly to those in Example 1. In Example 3, the read circuit is combined with the program-verify circuit in the NOR type memory cell explained in Example 1, while the read circuit may be combined with the program-verify circuit in the NAND type memory cell explained in Example 2. For this case, it is sufficient to exchange positions of the input lines $IN_1$ and $IN_2$ and the output lines $OUT_1$ and $OUT_2$ in the read circuit shown in FIG. 10.

The present invention has been explained with reference to preferred Examples hereinabove, while the present invention shall not be limited to those Examples. Examples mainly explain embodiments in which 2 bits are stored in one memory element, while the program-verify circuit of the present invention can be applied to an electrically re-writable memory cell which stores 3-bit or higher multi-valued data.

Figure 13:
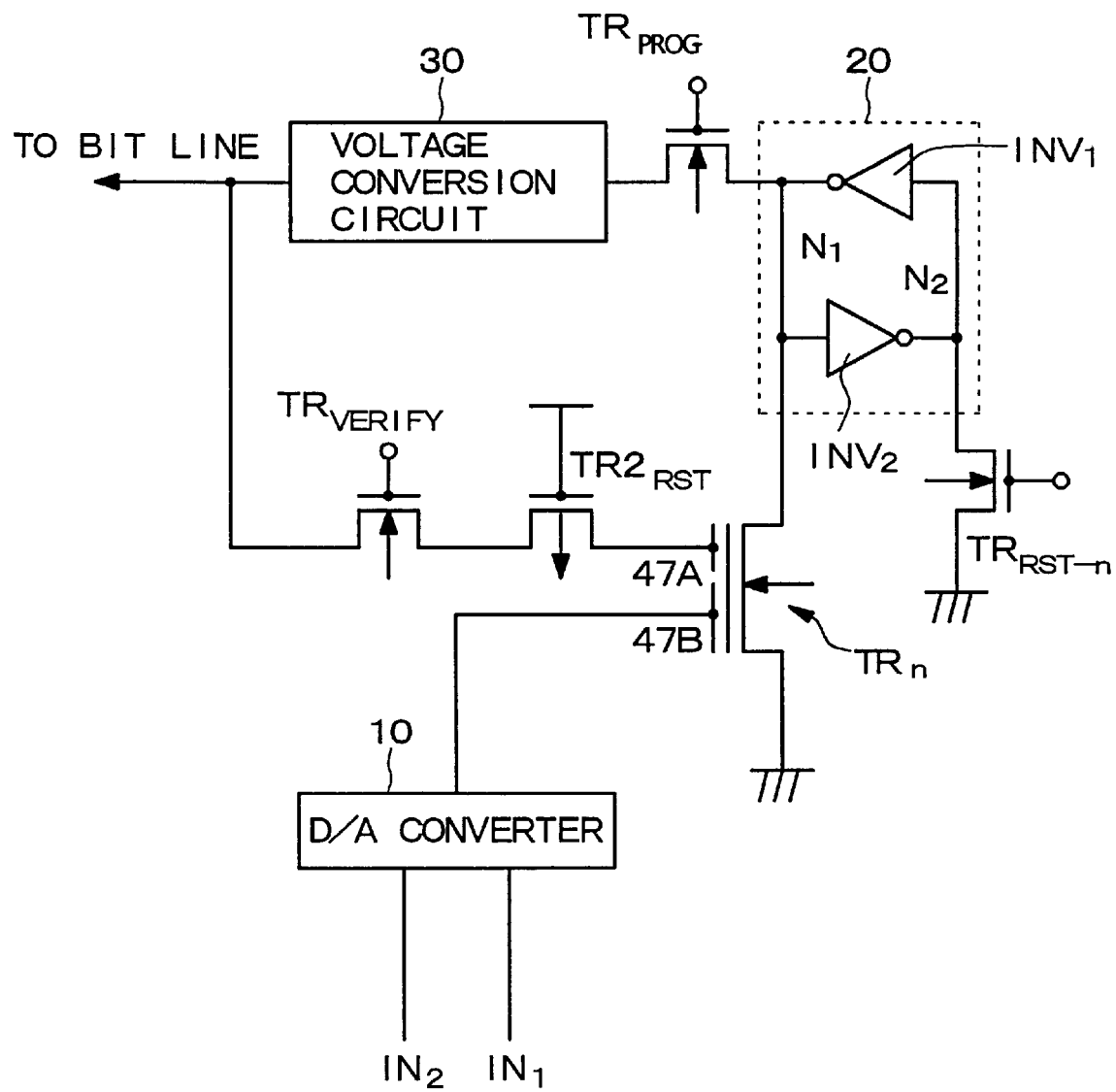
FIG. 13 a circuit diagram showing a variant of the program-verify circuit in Example 1.

In the program-verify circuit explained in Example 1, if the second reset transistor $TR2_{RST}$ is provided between the transistor $TR_{VERIFY}$ for verification and one input gate electrode 47A of the variable threshold voltage transistor $TR_n$ as shown in FIG. 13, the limitation of the expression (3) is no longer required, and all that is required is the limitation of the following expression (8) alone.

$$V_{th-n}^* > (C_B/C_{TOTAL})(2/4)V_{dd} \quad (8)$$

In the above circuit configuration, for writing data (1,1) in the memory element, the second reset transistor $TR2_{RST}$ is turned on, whereby the variable threshold voltage transistor $TR_n$ is brought into a conduction state, and the potential of the latch circuit 20 on the bit line side is brought into 0 volt. Therefore, no data is written in the memory element, and the threshold voltage $V_{th-11}$ in a data-erased state is retained. On the other hand, when data (1,0), (0,1) or (0,0) is written in the memory element, the second reset transistor $TR2_{RST}$ is turned off. The potential outputted from the output portion of the D/A converter 11 is $(2/4)V_{dd}$ or lower, so that the variable threshold voltage transistor $TR_n$ is in a non-conduction state. Therefore, the potential of the latch circuit 20 on the bit line side (potential in the node $N_1$) remains as the initial data ("H" state), and the data is written in the memory element in the form of pulses. That is, the threshold voltage $V_{th}$ of the memory element is increased.

Figure 14:
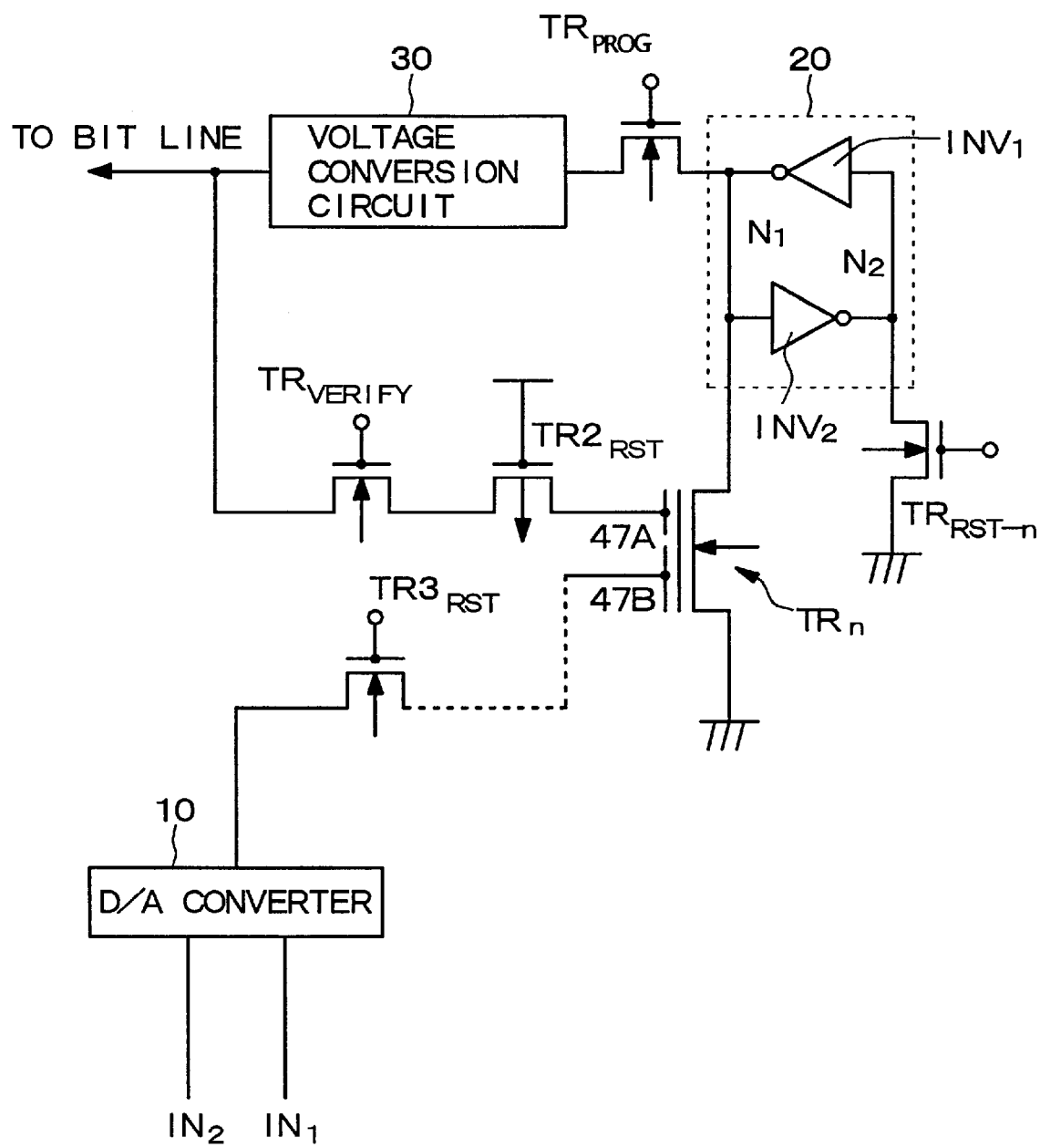
FIG. 14 a circuit diagram showing another variant of the program-verify circuit in Example 1.
Figure 15:
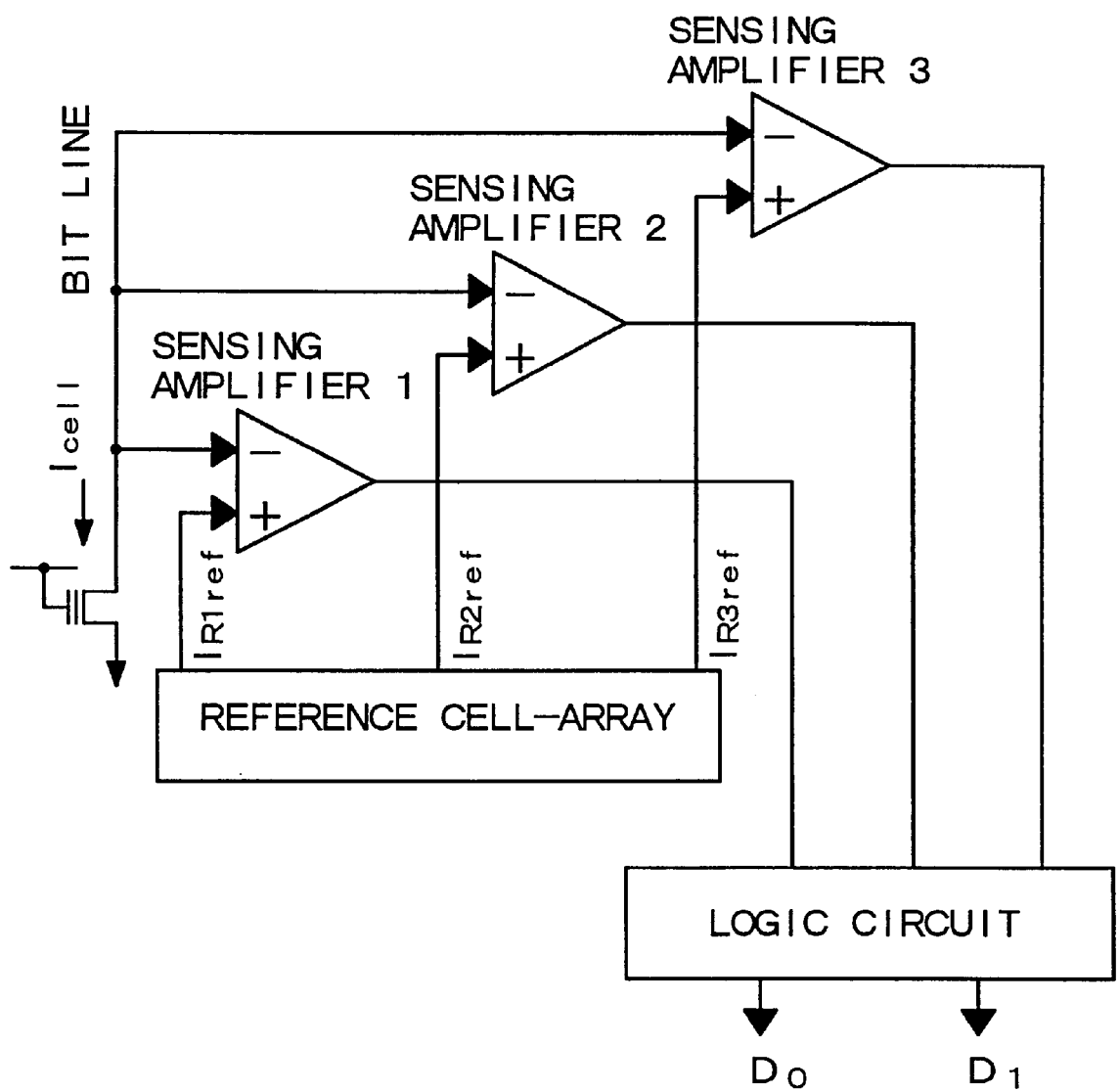
FIG. 15 is a circuit diagram for data readout in prior art.

Further, if third reset transistor $TR3_{RST}$ is provided between the D/A converter 11 and the other input gate electrode 47B of the variable threshold voltage transistor $TR_n$ as shown in FIG. 14, the limitation of the expression (3) or (8) is no longer required.

In the above circuit configuration, for writing data (1,1) in the memory element, the second reset transistor $TR2_{RST}$ is turned on and the third reset transistor $TR3_{RST}$ is turned off, whereby the variable threshold voltage transistor $TR_n$ is brought into a conduction state, and the potential of the latch circuit 20 on the bit line side is 0 volt. Therefore, the data is not written in the memory element, and the threshold voltage $V_{th-11}$ in a data-erased state is retained. On the other hand, when data (1,0), (0,1) or (0,0) is written in the memory element, the second reset transistor $TR2_{RST}$ is turned off and the third reset transistor $TR3_{RST}$ is turned on, whereby the variable threshold voltage transistor $TR_n$ is brought into a non-conduction state, the potential of the latch circuit 20 on the bit line side (potential in the node $N_1$) remains as the initial data ("H" state), and the data is written in the memory element in the form of pulses. That is, the threshold voltage $V_{th}$ of the memory element is increased.

The variable threshold voltage transistor is not structurally limited to a so-called neuron MOS transistor. The point is that the variable threshold voltage transistor is a transistor having a plurality of input gate electrodes and having a configuration which can permit the conduction/non-conduction state on the basis of high and low potentials inputted to the input gate electrodes, i.e., a configuration which permits a change in the apparent threshold voltage of the variable threshold voltage transistor. For example, the variable threshold voltage transistor can be constituted of a so-called XMOS type transistor having an input gate electrode formed on a channel forming region and an input gate electrode formed below the channel forming region. In this case, similarly, one input gate electrode can be connected to the memory cell through the bit line, and the other input gate electrode can be connected, e.g., to the output portion of the D/A converter.

The D/A converters 10 and 11 can be omitted. For example, when a quaternary value is stored in a memory cell, three input gate electrodes are provided in the variable threshold voltage transistor $TR_n$, one of the input gate electrodes is connected to the memory cell through a bit line, and the remaining input gate electrodes (two input gate electrodes in this case) are connected to the input lines $IN_1$ and $IN_2$, whereby the conduction/non-conduction state of the variable threshold voltage transistor can be controlled.

In the present invention, the program-verify circuit is constituted of a variable threshold voltage field-effect transistor, so that the circuit configuration thereof is simpler than any prior art circuit configuration. Further, since multi-valued data is detected at potential levels, it is not required to increase the number of sensing amplifiers and latches even if the multi-valued level increases. Moreover, since the multi-valued data can be detected all together at once, the multi-value method has almost no difference from the binary method in readout rate.

Further, the variable threshold voltage field-effect transistor may be constituted of a so-called neuron MOS transistor. In this case, since the variable threshold voltage field-effect transistor has a structure which is substantially the same as that of a memory cell, the variable threshold voltage field-effect transistor can be produced concurrently with the memory cell in the step of producing the memory cell, so that no additional step of producing the memory cell is required.

What is claimed is:

1. A program-verify circuit for an electrically re-writable memory cell which has a floating gate and a control gate and permits storage of a ternary or higher multi-valued data, the program-verify circuit comprising;
   (1) a variable threshold voltage field-effect transistor having a plurality of input gate electrodes, and
   (2) a latch circuit,
   wherein the latch circuit is connected to one source/drain region of the variable threshold voltage field-effect transistor and is to be connected to the memory cell through a bit line,
   one of the input gate electrodes of the variable threshold voltage field-effect transistor is to be connected to the memory cell through the bit line, and a potential for controlling the conduction/non-conduction state of the variable threshold voltage field-effect transistor is to be applied to the rest of the input gate electrodes.

2. The program-verify circuit of claim 1, wherein the variable threshold voltage field-effect transistor comprises;
   (A) source/drain regions,
   (B) a channel forming region between the source/drain regions,
   (C) one floating electrode formed on a first insulating film formed on the channel forming region, and
   (D) a plurality of input gate electrodes formed on a second insulating film formed on the floating electrode.

3. The program-verify circuit of claim 1, which further includes a digital/analog converter, the digital/analog converter being connected to output a potential for controlling the conduction/non-conduction state of the variable threshold voltage field-effect transistor constituting the program-verify circuit.

4. The program-verify circuit of claim 3, wherein the digital/analog converter comprises a variable threshold voltage field-effect transistor comprising;

(a) source/drain regions, (b) a channel forming region between the source/drain regions, (c) one floating electrode formed on a first insulating film formed on the channel forming region, and (d) a plurality of input gate electrodes which are formed on a second insulating film formed on the floating electrode and into which signals corresponding to multi-valued data to be stored are inputted, wherein a potential for controlling the conduction/non-conduction state of the variable threshold voltage field-effect transistor constituting the program-verify circuit is outputted from one of the source/drain regions.

5. The program-verify circuit of claim 4, which further includes a read circuit comprising an analog/digital converter and the digital/analog converter which comprises the variable threshold voltage field-effect transistor, wherein the analog/digital converter has an input portion connected to the bit line and has output portions connected to the input gate electrodes of the variable threshold voltage field-effect transistor constituting the digital/analog converter, and one of the source/drain regions of the variable threshold voltage field-effect transistor constituting the digital/analog converter is also connected to the input portion of the analog/digital converter.

6. The program-verify circuit of claim 5, wherein the variable threshold voltage field-effect transistor constituting the digital/analog converter has two input gate electrodes, the analog/digital converter comprises a variable threshold voltage inverter having two input portions and one output portion, and first, second and third inverters constituted of CMOS inverters, one of the input portions of the variable threshold voltage inverter and an input portion of the first inverter are connected to the bit line, an output portion of the first inverter is connected to the other of the input portions of the variable threshold voltage inverter and to an input portion of the third invertrer, the output portion of the variable threshold voltage inverter is connected to an input portion of the second inverter, and output portions of the second inverter and the third inverter are respectively connected to the two input gate electrodes of the digital/analog converter.

7. The program-verify circuit of claim 1, wherein the variable threshold voltage field-effect transistor is controlled to be brought from a non-conduction state into a conduction state when a bit line output potential reaches a predetermined potential.

8. The program-verify circuit of claim 1, wherein the memory cell is a NOR type nonvolatile semiconductor memory cell.

9. The program-verify circuit of claim 1, wherein the memory cell is a NAND type nonvolatile semiconductor memory cell.

10. A program-verify method used in an electrically re-writable memory cell which has a floating gate and a control gate and permits storage of a ternary or higher multi-valued data, the method using a program-verify circuit comprising;
(1) a variable threshold voltage field-effect transistor having a plurality of input gate electrodes, and
(2) a latch circuit, wherein the latch circuit is connected to one source/drain region of the variable threshold voltage field-effect transistor and is connected to the memory cell through a bit line, one of the input gate electrodes of the variable threshold voltage field-effect transistor is connected to the memory cell through the bit line, and a potential for controlling the conduction/non-conduction state of the variable threshold voltage field-effect transistor is applied to the rest of the input gate electrodes such that when a bit line output potential reaches a predetermined potential, the variable threshold voltage field-effect transistor is controlled to be brought from a non-conduction state into a conduction state, the program-verify method comprising a program-cycle and a verify-cycle, wherein, in the program-cycle, when data is to be written in the memory cell, a potential based on initial data latched in the latch circuit is outputted to the bit line, and in the verify-cycle, when the bit line output potential has not reached the predetermined potential, the program-cycle is re-performed, and when the bit line output potential has reached the predetermined potential, the variable threshold voltage field-effect transistor is brought from the non-conduction state into the conduction state to invert the initial data latched in the latch circuit, whereby further writing of data into the memory cell is inhibited.

* * * * *

UNITED STATES PATENT AND TRADEMARK OFFICE
CERTIFICATE OF CORRECTION

PATENT NO. : 6,009,015
DATED : December 28, 1999
INVENTOR(S) : Toshinobu SUGIYAMA It is certified that error appears in the above-identified patent and that said Letters Patent is hereby corrected as shown below: -

Column 19, line 41 et seq., claim 6, line 13, should read;

- -input portion of the third inverter- -

Signed and Sealed this

Eighth Day of May, 2001

Attest:

NICHOLAS P. GODICI

Attesting Officer

Acting Director of the United States Patent and Trademark Office